(12) United States Patent
Kato et al.

(10) Patent No.: US 7,951,656 B2
(45) Date of Patent: May 31, 2011

(54) METHOD FOR MANUFACTURING SEMICONDUCTOR DEVICE

(75) Inventors: Sho Kato, Ebina (JP); Satoshi Toriumi, Ebina (JP); Fumito Isaka, Zama (JP); Hideto Ohnuma, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 3 days.

(21) Appl. No.: 12/467,454

(22) Filed: May 18, 2009

(65) Prior Publication Data

US 2009/0305469 A1 Dec. 10, 2009

(30) Foreign Application Priority Data

Jun. 6, 2008 (JP) ................. 2008-149716

(51) Int. Cl.
*H01L 21/00* (2006.01)
*H01L 21/336* (2006.01)
*H01L 21/30* (2006.01)

(52) U.S. Cl. ........ 438/151; 438/197; 438/222; 438/308; 438/458; 257/347; 257/351; 257/E21.567; 257/E21.568

(58) Field of Classification Search ............ 438/151, 438/164, 197, 222, 458, 308; 257/368, 617, 257/347, 351, E21.567, E21.568
See application file for complete search history.

(56) References Cited

U.S. PATENT DOCUMENTS

| | | | |
|---|---|---|---|
| 4,496,788 A | 1/1985 | Hamakawa et al. | |
| 5,371,037 A | 12/1994 | Yonehara | |
| 5,374,564 A | 12/1994 | Bruel | |
| 5,665,607 A | 9/1997 | Kawama et al. | |
| 5,736,431 A | 4/1998 | Shinohara et al. | |
| 5,840,616 A | 11/1998 | Sakaguchi et al. | |
| 5,854,123 A | 12/1998 | Sato et al. | |
| 6,284,629 B1 | 9/2001 | Yokokawa et al. | |
| 6,372,609 B1 | 4/2002 | Aga et al. | |
| 6,380,046 B1 | 4/2002 | Yamazaki | |
| 6,534,380 B1 | 3/2003 | Yamauchi et al. | |
| 6,566,277 B1 | 5/2003 | Nakagawa et al. | |
| 6,692,981 B2 | 2/2004 | Takato et al. | |
| 6,818,529 B2 | 11/2004 | Bachrach et al. | |
| 7,678,668 B2 * | 3/2010 | Shimomura et al. ......... 438/458 |

(Continued)

FOREIGN PATENT DOCUMENTS

EP 0 971 395 1/2000

(Continued)

*Primary Examiner* — Hsien-ming Lee
(74) *Attorney, Agent, or Firm* — Eric J. Robinson; Robinson Intellectual Property Law Office, P.C.

(57) ABSTRACT

A stack including at least an insulating layer, a first electrode, and a first impurity semiconductor layer is provided over a supporting substrate; a first semiconductor layer to which an impurity element imparting one conductivity type is added is formed over the first impurity semiconductor layer; a second semiconductor layer to which an impurity element imparting the one conductivity type is added is formed over the first semiconductor layer under a condition different from that of the first semiconductor layer; crystallinity of the first semiconductor layer and crystallinity of the second semiconductor layer are improved by a solid-phase growth method to form a second impurity semiconductor layer; an impurity element imparting the one conductivity type and an impurity element imparting a conductivity type different from the one conductivity type are added to the second impurity semiconductor layer; and a gate electrode layer is formed via a gate insulating layer.

13 Claims, 12 Drawing Sheets
(1 of 12 Drawing Sheet(s) Filed in Color)

U.S. PATENT DOCUMENTS

| | | |
|---|---|---|
| 2001/0046746 A1 | 11/2001 | Yokokawa et al. |
| 2008/0099065 A1 | 5/2008 | Ito et al. |

FOREIGN PATENT DOCUMENTS

| | | |
|---|---|---|
| JP | 59-124772 | 7/1984 |
| JP | 59-175170 | 10/1984 |
| JP | 06-044638 | 6/1994 |
| JP | 10-093122 | 4/1998 |
| JP | 10-335683 | 12/1998 |
| JP | 11-040786 | 2/1999 |
| JP | 11-097379 | 4/1999 |
| JP | 11-121310 | 4/1999 |
| JP | 11-163363 | 6/1999 |
| JP | 2000-030995 | 1/2000 |
| JP | 2000-150940 | 5/2000 |
| JP | 2002-348198 | 12/2002 |
| JP | 2005-268682 | 9/2005 |

* cited by examiner

FIG. 1B
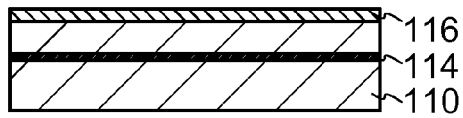
FIG. 1A
FIG. 1C
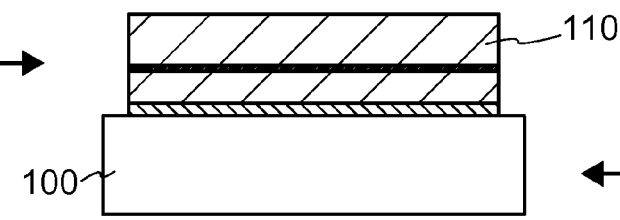
FIG. 1D
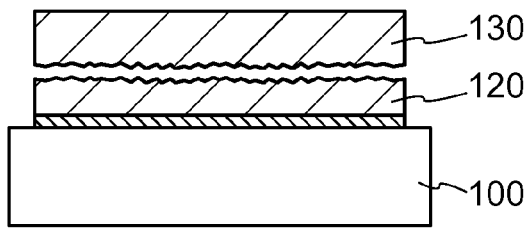
FIG. 1E
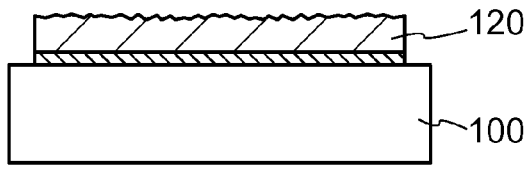

FIG. 3A
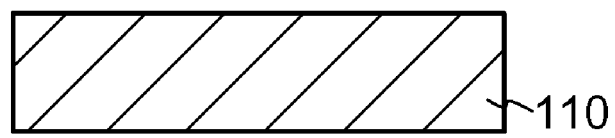
FIG. 3B
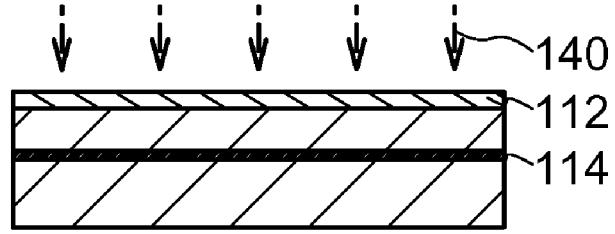
FIG. 3C
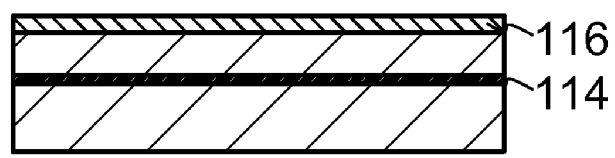

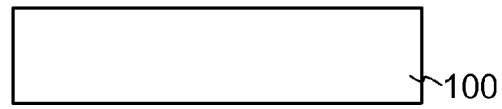
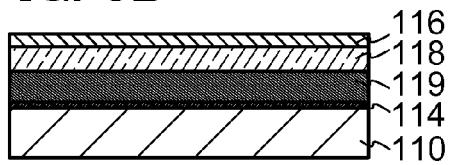
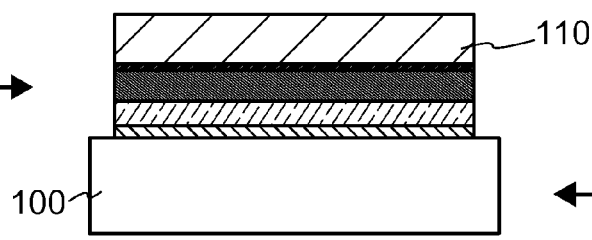
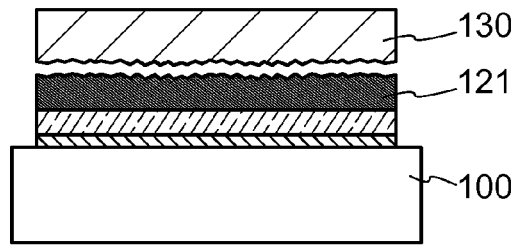
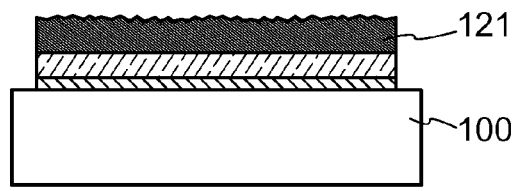
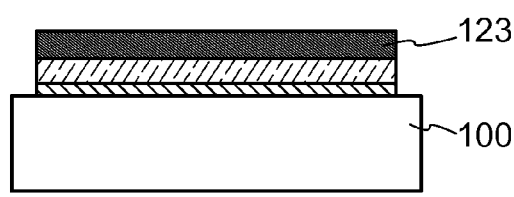

FIG. 7A
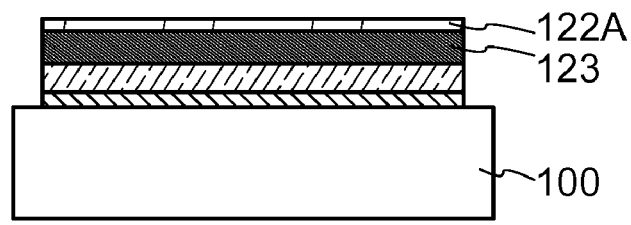
FIG. 7B
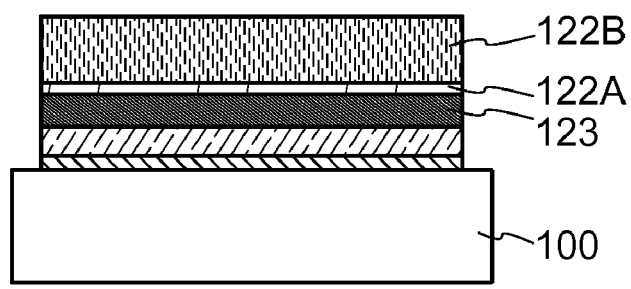
FIG. 7C
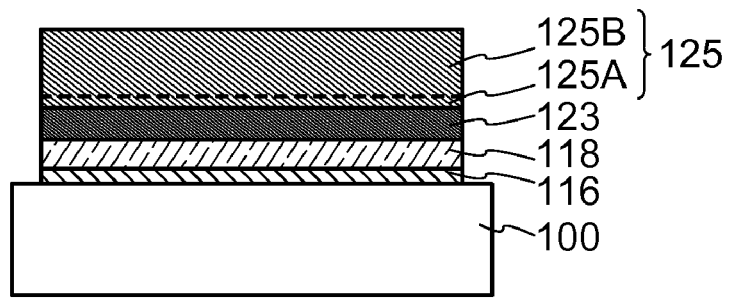

METHOD FOR MANUFACTURING SEMICONDUCTOR DEVICE

BACKGROUND OF THE INVENTION

1. Field of the Invention

The present invention relates to a method for manufacturing a semiconductor device.

2. Description of the Related Art

In recent years, an SOI (silicon on insulator) substrate has been used for a semiconductor device for high performance device. By utilizing characteristics of a thin single crystal silicon layer formed over an insulating layer, transistors formed in the integrated circuit can be electrically separated from each other completely. Further, each transistor can be formed as a fully-depleted transistor, and thus a semiconductor integrated circuit with high added value such as high integration, high speed driving, and low power consumption can be realized.

As a method for manufacturing such an SOI substrate described above, a so-called hydrogen ion implantation separation method in which hydrogen ion implantation and separation are combined is known. A typical process of a hydrogen ion separation method is described below.

First, hydrogen ions are implanted into a silicon substrate to form an ion implantation layer at a predetermined depth from a surface of the substrate. Then, another silicon substrate which functions as a base substrate (a supporting substrate) is oxidized to form a silicon oxide layer. After that, the silicon substrate into which the hydrogen ions are implanted and the silicon oxide layer on the other silicon substrate functioning as the base substrate are closely attached to each other to bond the two silicon substrates together. Then, by performing heat treatment the other silicon substrate is separated at the ion implantation layer to form a thin single crystal silicon layer.

The single crystal silicon layer formed by such a method described above is very thin and has a thickness of approximately 50 nm to 30 nm in general. Therefore, use of a single crystal silicon layer formed by such a method described above is extremely suitable for a transistor for which high integration and low power consumption are needed. On the other hand, considering use for a power device or a photoelectric conversion device, a single crystal silicon layer needs to have a predetermined thickness in view of improvement of withstand voltage, improvement of photoelectric conversion efficiency, and the like.

The thickness of a single crystal silicon layer formed by an ion implantation separation method mainly depends on accelerating voltage in a step of ion implantation. Since an ion implantation layer is formed in a shallow region when accelerating voltage is reduced, the single crystal silicon layer is formed thin. On the other hand, when accelerating voltage is increased the single crystal semiconductor layer is formed thick.

According to this, it is understood that accelerating voltage is increased simply in order to thicken the single crystal semiconductor layer. However, it is not practically easy to form the thick single crystal semiconductor layer while increasing accelerating voltage. This is because, in the case of using an ion implantation apparatus suitable for mass production (an apparatus in which large current can flow), accelerating voltage cannot be more increased than a predetermined value due to its limit. It is possible to increase accelerating voltage in the case of using an apparatus with small current; however, it takes time in order to obtain a predetermined amount of ions for implantation, which is unfavorable in view of productivity. Further, in the case where ions are accelerated by high voltage exceeding 100 kV, harmful radial rays are generated; therefore, there is a problem in safety.

To solve such problems described above, a method for thickening a single crystal semiconductor layer by epitaxial growth has been considered (for example, see Reference 1).

[Reference]

[Patent Document]

[Patent Document 1]

Japanese Published Patent Application No. 2000-30995

SUMMARY OF THE INVENTION

The method disclosed in Patent Document 1 is a method in which a single crystal semiconductor layer formed using a hydrogen ion implantation separation method is grown by vapor-phase growth (vapor-phase epitaxial growth) using a method such as a CVD (chemical vapor deposition) method. However, when the single crystal semiconductor layer is formed by such a method described above, it is difficult to increase the deposition rate thereof to be higher than or equal to a certain deposition rate, which becomes a serious problem in consideration of mass production of semiconductor devices.

In view of the aforementioned problems, an object is to provide a semiconductor substrate by employing a method suitable for mass production. Further, another object is to provide a semiconductor substrate having excellent characteristics while resources are used effectively. In addition, another object is to provide a semiconductor device (for example, a power device) using the semiconductor substrate.

In an embodiment of the present invention to be disclosed in this specification and the like (including at least a description, claims, and drawings), a semiconductor substrate is manufactured with high productivity by using a solid-phase growth (solid-phase epitaxial growth) method. More specifically, the semiconductor substrate is manufactured through the following steps: first, a semiconductor layer having high crystallinity is formed thin over a single crystal semiconductor layer which has been formed by slicing a single crystal semiconductor substrate; then, a semiconductor layer having low crystallinity is formed thick over the semiconductor layer having high crystallinity; after that, the aforementioned stacked-layer structure is subjected to heat treatment or the like, whereby a thick single crystal semiconductor layer is formed using solid-phase growth.

The aforementioned "semiconductor layer having high crystallinity" can be formed by a plasma CVD method with use of a mixed gas of a silane-based gas and hydrogen. For example, the aforementioned "semiconductor layer having high crystallinity" can be formed by using a mixed gas of a silane-based gas and hydrogen which includes hydrogen at a flow rate greater than or equal to 50 times, preferably greater than or equal to 100 times that of the silane-based gas. Note that since the aforementioned "semiconductor layer having high crystallinity" is greatly influenced by the crystallinity of the single crystal semiconductor layer formed by slicing, the aforementioned manufacturing method can be especially called as a vapor-phase growth (vapor-phase epitaxial growth) method. However, the crystallinity of the semiconductor layer having high crystallinity is not limited to be single crystal and may be higher crystallinity with respect to the "semiconductor layer having low crystallinity" formed later.

"The semiconductor layer having low crystallinity" may be formed by any method. For example, in a similar manner to "the semiconductor layer having high crystallinity", "the semiconductor layer having low crystallinity" can be formed by a plasma CVD method using a mixed gas of a silane-based gas and hydrogen. In this case, it is preferable that a condition with a higher deposition rate than that in the case of "the semiconductor layer having high crystallinity" be employed. For example, the semiconductor layer having low crystallinity can be formed using a source gas including hydrogen at a flow rate of greater than or equal to 2 times and less than or equal to 20 times (preferably, greater than or equal to 5 times and less than or equal to 15 times) that of a silane-based gas.

Further, with the use of the aforementioned semiconductor substrate, a semiconductor device, for example, a power device is manufactured. Here, a power device refers to a semiconductor device used for power conversion, which has a high withstand voltage, large current, and a high speed in power conversion. As a power device, a power MOSFET can be given, for example. A power MOSFET is characterized by a high switching speed, a high conversion efficiency with a comparatively low voltage, as compared to other power devices. Note that as examples of a power device, a rectifier diode, a power transistor, an insulated gate bipolar transistor (IGBT), a thyristor, a gate turnoff thyristor (GTO), a triac, and the like are given.

Described below is a specific manufacturing method of a semiconductor device which is an embodiment of the invention to be disclosed.

One feature of the manufacturing method of the semiconductor device which is an embodiment of the invention to be disclosed is that: a single crystal semiconductor substrate to which an impurity element imparting one conductivity type is added is irradiated with ions to form a damaged region in the single crystal semiconductor substrate; a first electrode and an insulating layer are formed over a surface of the single crystal semiconductor substrate; the insulating layer and a supporting substrate are closely attached to each other to bond the single crystal semiconductor substrate and the supporting substrate together; the single crystal semiconductor substrate is separated at the damaged region to form a stack including at least the insulating layer, the first electrode, a first impurity semiconductor layer over the supporting substrate; a first semiconductor layer to which an impurity element imparting the one conductivity type is added is formed over the first impurity semiconductor layer; a second semiconductor layer to which an impurity element imparting the one conductivity type is added is formed over the first semiconductor layer in a manner different from that of the first semiconductor layer; crystallinity of the first semiconductor layer and the crystallinity of the second semiconductor layer are improved by a solid-phase growth method to form a second impurity semiconductor layer; an impurity element imparting the one conductivity type is added to the second impurity semiconductor layer to form a source region and a drain region; an impurity element imparting a conductivity type different from the one conductivity type is added to form a channel formation region; a gate electrode layer is formed over the channel formation region with a gate insulating layer interposed therebetween; and a source electrode layer and drain electrode layer which are electrically connected to the source region and the drain region are formed.

In the above description, it is preferable that the first impurity semiconductor layer be a high-concentration impurity semiconductor layer and the second impurity semiconductor layer be a low-concentration impurity semiconductor layer.

In the above description, the first semiconductor layer and the second semiconductor layer are preferably formed so that the crystallinity of the first semiconductor layer is higher than that of the second semiconductor layer. The first semiconductor layer and the second semiconductor layer may be formed so that the hydrogen concentration of the first semiconductor layer is lower than that of the second semiconductor layer.

Further, in the above description, the first semiconductor layer is preferably formed so as to have a thickness of greater than or equal to 10 nm and less than or equal to 100 nm and the second semiconductor layer is preferably formed so as to have a thickness of greater than or equal to 300 nm.

In addition, as the aforementioned ions, ions generated using a source gas including hydrogen are preferably used. The first semiconductor layer is preferably formed by a plasma chemical vapor deposition method in which a flow rate of a hydrogen gas is greater than or equal to 50 times that of a silane-based gas.

Note that in this specification and the like, the term "single crystal" refers to a crystal which has a regular crystal structure and crystal axes oriented in a uniform direction in all portions of the crystal. However, in an embodiment of the invention to be disclosed, irregularity, such as defects and lattice distortion, is not excluded.

In an embodiment of the invention to be disclosed, a semiconductor layer having low crystallinity (or a semiconductor having high hydrogen concentration) is formed and is grown by solid-phase growth to thicken a single crystal semiconductor layer. Accordingly, the deposition rate of the single crystal semiconductor layer can be increased and productivity of a semiconductor device can be improved, as compared with the case where a single crystal semiconductor layer is formed by only vapor-phase growth. Further, in an embodiment of the invention to be disclosed, after a crystal semiconductor layer (also referred to as a buffer layer) is formed over the single crystal semiconductor layer formed by slicing a single crystal semiconductor substrate, the semiconductor layer having low crystallinity (for example, an amorphous semiconductor layer or the like) is formed. Accordingly, peeling of the semiconductor layer in heat treatment or the like in solid-phase growth can be prevented. That is, the single crystal semiconductor layer having an enough thickness can be formed with a high yield.

Further, in an embodiment of the invention to be disclosed, since it is not necessary to separate a single crystal semiconductor layer from a single crystal semiconductor substrate so that the single crystal semiconductor layer has a large thickness, problems due to accelerating voltage in the ion irradiation can be solved. In addition, the single crystal semiconductor substrate from which the single crystal semiconductor layer has been separated can be used repeatedly, whereby a manufacturing cost of a semiconductor device is suppressed.

In this manner, according to an embodiment of the invention to be disclosed, the semiconductor device having excellent characteristics can be provided with high productivity.

BRIEF DESCRIPTION OF THE DRAWINGS

The patent or application file contains at least one drawing executed in color. Copies of this patent or patent application publication with the color drawing will be provided by the Office upon request and payment of the necessary fee.

FIGS. 1A to 1E illustrate a manufacturing process of a semiconductor substrate;

FIGS. 3A to 3C illustrate a manufacturing process of a semiconductor substrate;

FIGS. 6A to 6F illustrate a manufacturing process of a semiconductor substrate;

FIGS. 7A to 7C illustrate a manufacturing process of a semiconductor substrate;

Figure 2A:
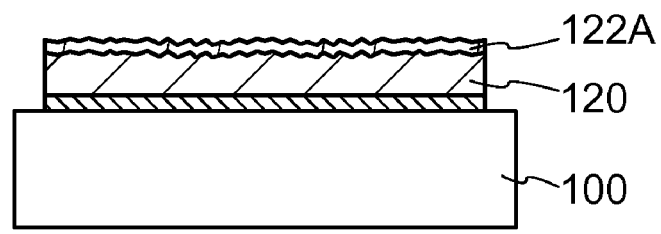
FIGS. 2A to 2C illustrate a manufacturing process of a semiconductor substrate.

Hereinafter, Embodiments are described in detail using the drawings. Note that the invention to be disclosed in this specification and the like is not limited to the description of the embodiments given below, and it is apparent to those skilled in the art that the modes and details can be modified in many different ways without departing from the spirit of the invention. A structure of the different embodiment can be implemented by combination appropriately. On the description of the invention with reference to the drawings, a reference numeral indicating the same part is used in common throughout different drawings, and the repeated description is omitted.

Embodiment 1

This embodiment describes a basic example of a method for manufacturing a semiconductor substrate which can be used for a semiconductor device with reference to FIGS. 1A to 1E, FIGS. 2A to 2C, and FIGS. 3A to 3C.

First, a supporting substrate 100 is prepared (see FIG. 1A). As the supporting substrate 100, a light-transmitting glass substrate used for liquid crystal display devices or the like can be used. As a glass substrate, a substrate having a strain point of higher than or equal to 580° C. and lower than or equal to 680° C. (preferably, higher than or equal to 600° C. and lower than or equal to 700° C.) is preferably used. Further, it is preferable that the glass substrate be a non-alkali glass substrate. As a material of the non-alkali glass substrate, a glass material such as aluminosilicate glass, aluminoborosilicate glass, or barium borosilicate glass is used, for example.

Note that, as the supporting substrate 100, in addition to the glass substrate, a substrate which is formed from an insulator, such as a ceramic substrate, a quartz substrate, or a sapphire substrate; a substrate which is formed from a semiconductor such as silicon; a substrate which is formed from a conductor such as metal or stainless steel; or the like can be used.

Although not described in this embodiment, an insulating layer may be formed over a surface of the supporting substrate 100. In the case where impurities (such as an alkali metal or an alkaline earth metal) are included in the supporting substrate 100 by provision of the insulating layer, diffusion of the impurities into a semiconductor layer can be prevented. The insulating layer may have either a single-layer structure or a stacked layer structure. As a material used for forming the insulating layer, silicon oxide, silicon nitride, silicon oxynitride, silicon nitride oxide or the like can be given.

Here, a silicon oxynitride refers to the one in which the content (the number of atoms) of oxygen is larger than the content of nitrogen and for example, silicon oxynitride includes oxygen, nitrogen, silicon, and hydrogen at concentrations of greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0.1 at. % and less than or equal to 10 at. %, respectively. Further, silicon nitride oxide refers to the one in which the content (the number of atoms) of nitrogen is larger than the content of oxygen and includes, for example, oxygen, nitrogen, silicon, and hydrogen at concentrations of greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 25 at. %, respectively. Note that rates of oxygen, nitrogen, silicon, and hydrogen fall within the aforementioned ranges in the cases where measurement is performed using Rutherford backscattering spectrometry (RBS) or hydrogen forward scattering (HFS). Moreover, the total of the content rate of the constituent elements does not exceed 100 at. %.

Next, a single crystal semiconductor substrate 110 is prepared. As the single crystal semiconductor substrate 110, for example, a semiconductor substrate formed from an element belonging to Group 4 of the periodic table, such as silicon, germanium, silicon-germanium, or silicon carbide can be used. Needless to say, a substrate formed of a compound semiconductor such as gallium arsenide or indium phosphide may be used. In this embodiment, as the single crystal semiconductor substrate 110, a single crystal silicon substrate is used. Although there is no limitation on the size of the single crystal semiconductor substrate 110, for example, a circular semiconductor substrate having a diameter of 8 inches (200 mm), 12 inches (300 mm), or 18 inches (450 nm) can be processed into a rectangular shape for being used as the single crystal semiconductor substrate 110.

The single crystal semiconductor substrate 110 is subjected to various treatments to form a damaged region 114 and an insulating layer 116 (see FIG. 1B). The details of the various treatments is described later with reference to FIGS. 3A to 3C. Note that the damaged region 114 is a region into which ions are introduced and the single crystal semiconductor substrate 110 can be separated at the damaged region 114. Thus, the thickness of a single crystal semiconductor layer separated from the single crystal semiconductor substrate 110 is determined depending on the depth at which the damaged region 114 is formed. In an embodiment of the invention to be disclosed, the damaged region 114 is formed at a depth of greater than or equal to 50 nm and less than or equal to 300 nm from a surface of the single crystal semiconductor substrate 110.

Further, a surface of the insulating layer 116 preferably has high flatness since the insulating layer 116 is a layer for bonding. For such an insulating layer 116, for example, a silicon oxide film formed using an organosilane gas by a chemical vapor deposition method can be used. In addition, a silicon oxynitride film, a silicon nitride oxide film, an aluminum oxide film, or the like may be used.

Figure 11A:
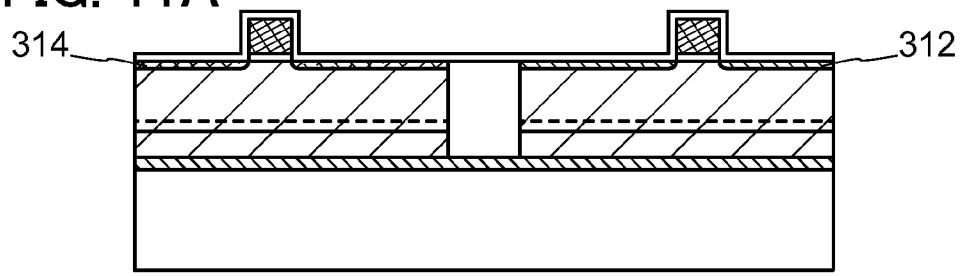
FIGS. 11A to 11D illustrate a manufacturing process of a semiconductor device.
Figure 11B:
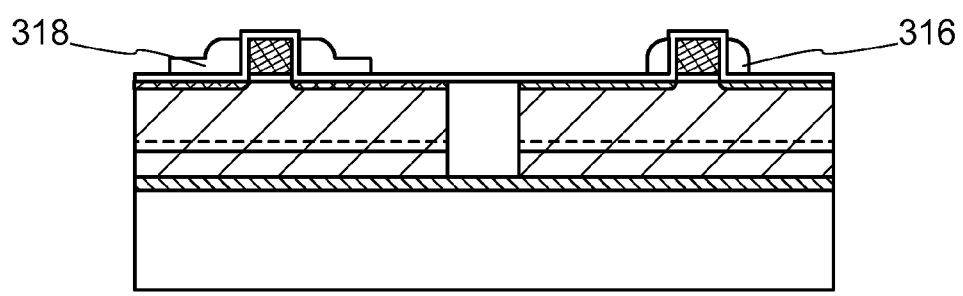
Figure 11C:
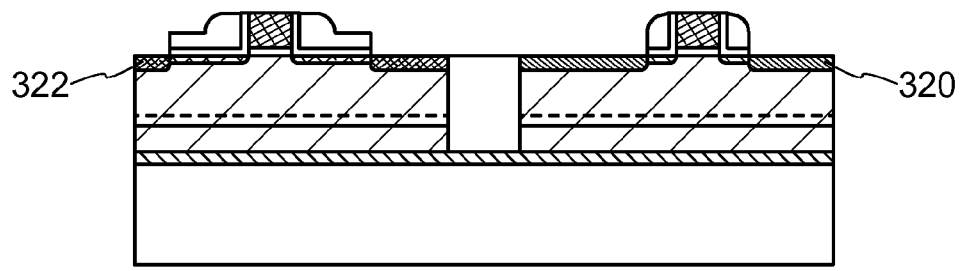
Figure 11D:
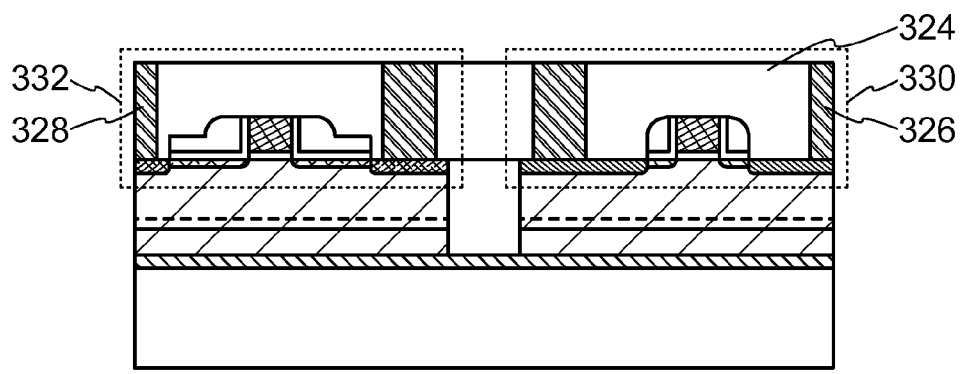

Then, the aforementioned supporting substrate 100 and the single crystal semiconductor substrate 110 are bonded to each other (see FIG. 11C). Specifically, after cleaning the surfaces of the supporting substrate 100 and the insulating layer 116 by a method such as ultrasonic cleaning, the surface of the supporting substrate 100 and the surface of the insulating layer 116 are disposed to be in contact with each other. Then, pressure treatment is performed so that the surface of the supporting substrate 100 and the surface of the insulating layer 116 are bonded to each other. Note that as a mechanism of the bonding, a mechanism involving van der Waals forces, a mechanism involving hydrogen bond, or the like is given.

Note that before the above bonding, the surface of the supporting substrate 100 or the surface of the insulating layer 116 may be subjected to oxygen plasma treatment or ozone treatment so as to be hydrophilic. By this treatment, dust such as an organic material on the surface of the supporting substrate 100 or the insulating layer 116 can be removed. Further, hydroxyl is added to the surface of the supporting substrate 100 or the surface of the insulating layer 116, so that a hydrogen bond can be formed at an interface for the bonding.

Here, an example of ozone treatment is described. For example, a surface of an object to be processed can be subjected to ozone treatment by performing irradiation with ultraviolet (UV) rays under an atmosphere including oxygen. Ozone treatment performed by irradiation with ultraviolet rays under an atmosphere including oxygen is referred to as UV ozone treatment or ultraviolet ray ozone treatment. Under an atmosphere including oxygen, irradiation with light having a wavelength less than 200 nm and light having a wavelength of greater than or equal to 200 nm of ultraviolet rays is performed, whereby ozone can be generated and singlet oxygen can be generated from ozone. Irradiation with light having a wavelength of less than 180 nm of ultraviolet rays is performed, whereby ozone can be generated and singlet oxygen also can be generated.

Described below are examples of reactions which are caused by performing the irradiation with light having a wavelength of less than 200 nm and light having a wavelength of greater than or equal to 200 nm under the atmosphere including oxygen.

$$O_2 + h\nu(\lambda_1 \text{ nm}) \rightarrow O(^3P) + O(^3P) \quad (1)$$

$$O(^3P) + O_2 \rightarrow O_3 \quad (2)$$

$$O_3 + h\nu(\lambda_2 \text{ nm}) \rightarrow O(^1D) + O_2 \quad (3)$$

In the above reaction formula (1), irradiation with light (hν) having a wavelength of less than 200 nm ($\lambda_1$ nm) is performed under an atmosphere including oxygen ($O_2$), whereby oxygen atoms in a ground state ($O(^3P)$) is generated. Next, in the above reaction formula (2), an oxygen atom in a ground state ($O(^3P)$) and oxygen ($O_2$) react to each other, whereby ozone ($O_3$) is generated. Then, in the above reaction formula (3), irradiation with light having a wavelength of greater than or equal to 200 nm ($\lambda_2$ nm) is performed under an atmosphere including ozone ($O_3$), whereby singlet oxygen in an excited state $O(^1D)$ is generated. While ozone is generated by performing the irradiation with light having a wavelength less than 200 nm of ultraviolet rays under the atmosphere including oxygen, decomposition of ozone is caused by performing the irradiation with light having a wavelength of greater than or equal to 200 nm, whereby singlet oxygen is generated. The ozone treatment described above can be performed by irradiation with a low-pressure mercury lamp ($\lambda_1$=185 nm and $\lambda_2$=254 nm) under an atmosphere including oxygen, for example.

Further, described are examples of reactions which are caused by performing the irradiation with light having a wavelength of less than 180 nm under an atmosphere including oxygen.

$$O_2 + h\nu(\lambda_3 \text{ nm}) \rightarrow O(^1D) + O(^3P) \quad (4)$$

$$O(^3P) + O_2 \rightarrow O_3 \quad (5)$$

$$O_3 + h\nu(\lambda_3 \text{ nm}) \rightarrow O(^1D) + O_2 \quad (6)$$

In the above reaction formula (4), irradiation with light having a wavelength of less than 180 nm ($\lambda_3$ nm) is performed under an atmosphere including oxygen ($O_2$), whereby singlet oxygen in an excited state ($O(^1D)$) and an oxygen atom in a ground state ($O(^3P)$) are generated. Next, in the above reaction formula (5), an oxygen atom in a ground state ($O(^3P)$) and oxygen ($O_2$) react to each other, whereby ozone ($O_3$) is generated. In the above reaction formula (6), irradiation with light having a wavelength of less than 180 nm ($\lambda_3$ nm) is performed under an atmosphere including generated ozone ($O_3$), whereby singlet oxygen ($O(^1D)$) in an excited state and oxygen are generated. By performing the irradiation with light having a wavelength of less than 180 nm of ultraviolet rays under the atmosphere including oxygen, ozone is generated and ozone or oxygen are decomposed to generate singlet oxygen. The ozone treatment described above can be performed by irradiation with an Xe excimer UV lamp ($\lambda_3$nm=172 nm) under an atmosphere including oxygen, for example.

A chemical bond of an organic material or the like adhered to a surface of an object to be processed can be broken by the light having a wavelength of less than 200 nm and oxidative decomposition of can be caused in an organic material adhered to the surface of the object to be processed, the organic material whose chemical bond is broken, and the like by ozone or singlet oxygen generated by ozone, whereby they are removed. By performing the ozone treatment described above, hydrophilicity and cleanliness of the surface of the object to be processed can be increased and favorable bonding can be performed.

By irradiation with ultraviolet rays under an atmosphere including oxygen, ozone is generated. Ozone has an effect of removing an organic material adhered to the surface of the object to be processed. Further, singlet oxygen also has an effect of removing an organic material adhered to the surface of the object to be processed, which is as effective as or more effective than ozone. Ozone and singlet oxygen are examples of oxygen in an activated state and collectively referred to as active oxygen. As described in the above reaction formulae and the like, there is reaction of generation of ozone in generation of singlet oxygen or reaction of generation of singlet oxygen from ozone. Therefore, here, reaction including reaction to which singlet oxygen contributes is referred to as ozone treatment for convenience.

Next, heat treatment is performed on the supporting substrate 100 and the single crystal semiconductor substrate 110 which are bonded to each other, so that bonding force is increased. The heat temperature at this time needs to be a temperature that does not promote separation at the damaged region 114. For example, a temperature lower than 400° C., more preferably lower than or equal to 300° C. can be employed. There is no particular limitation on heat treatment time, and an optimal condition may be set as appropriate in accordance with a relation between processing speed and bonding force. Note that in this embodiment, heat treatment is performed at 200° C. for two hours. Here, only a region for the bonding may be irradiated with a microwave so that the region for the bonding can be locally heated. Note that, in the case where there is no problem with bonding force, the aforementioned heat treatment may be omitted.

Next, the single crystal semiconductor substrate 110 is separated into a first single crystal semiconductor layer 120 and a single crystal semiconductor substrate 130 at the damaged region 114 (see FIG. 1D). The separation of the single crystal semiconductor substrate 110 is performed by heat treatment. The heat treatment temperature can be determined based on the allowable temperature limit of the supporting substrate 100. In the case of using a glass substrate as the supporting substrate 100, for example, heat treatment temperature is preferably set to higher than or equal to 400° C. and lower than or equal to 650° C. Note that the upper limit of the aforementioned heat treatment temperature can be set as appropriate in accordance with heat resistance of the supporting substrate 100. For example, when the supporting substrate 100 can resist heat treatment at a temperature of less than or equal to 750° C., heat treatment may be performed at a temperature of less than or equal to 750° C. Note that in this embodiment, heat treatment is performed at 600° C. for two hours.

By performing the aforementioned heat treatment, the volume of microvoids formed in the damaged region 114 is changed, and a crack is generated in the damaged region 114. As a result, the single crystal semiconductor substrate 110 is separated at the damaged region 114. Since the insulating layer 116 is bonded to the supporting substrate 100, the first single crystal semiconductor layer 120 separated from the single crystal semiconductor substrate 110 remains over the base substrate 100. Further, since the interface for bonding the insulating layer 116 to the supporting substrate 100 is heated by this heat treatment, a covalent bond is formed at the interface for bonding, so that the bonding force between the supporting substrate 100 and the insulating layer 116 is further improved. Note that the single crystal semiconductor substrate 130 which has been separated can be used repeatedly after recycling treatment. After the recycling treatment, the single crystal semiconductor substrate 130 may be used as a substrate from which another single crystal semiconductor layer is obtained or may be used for any other purpose. In the case where the single crystal semiconductor substrate 130 is used as a substrate from which another single crystal semiconductor layer is obtained, a plurality of single crystal semiconductor layers can be formed from one single crystal semiconductor substrate.

In the semiconductor substrate formed as described above, defects due to the separation step or the ion irradiation step exist on a surface of the first single crystal semiconductor layer 120, and flatness of the surface is impaired. Therefore, treatment for repairing defects or treatment for flattening a surface of the first single crystal semiconductor layer 120 may be performed. Note that the following treatment for repairing defects and treatment for flattening a surface is not necessarily performed.

As the treatment for repairing defects and the treatment for flattening a surface, laser beam irradiation may be used. By irradiation with a laser beam from above the first single crystal semiconductor layer 120, the upper portion of the first single crystal semiconductor layer 120 is melted, and then cooled and solidified, so that defects are repaired and flatness of the surface is improved. In the laser beam irradiation, heat treatment within the allowable temperature limit of the supporting substrate may also be performed. By heating the supporting substrate, defects can be reduced efficiently.

Note that it is preferable that the first single crystal semiconductor layer 120 be partially melted by the laser beam irradiation. This is because, if the first single crystal semiconductor layer 120 is completely melted, it is microcrystallized due to disordered nucleation after being in a liquid phase, so that the crystallinity of the first single crystal semiconductor layer 120 is highly likely to decrease. On the contrary, by partial melting, crystal growth proceeds from a solid phase part, which is not melted. Accordingly, the defects in the semiconductor layer can be reduced. Note that the term "complete melting" here refers to that the first single crystal semiconductor layer 120 is melted down to the vicinity of the lower interface thereof to be made in a liquid phase. On the other hand, in this case, the term "partial melting" refers to that the upper part of the first single crystal semiconductor layer 120 is melted to be made in a liquid phase while the lower part thereof is not melted and is still in a solid phase.

A pulsed oscillation laser beam (pulsed laser beam) is preferably used for the laser beam irradiation. This is because the partially melted state can be easily obtained by using a high-energy pulsed laser beam. The repetition rate is preferably about greater than or equal to 1 Hz and less than or equal to 10 MHz, more preferably greater than or equal to 10 Hz and less than or equal to 1 MHz. As examples of the aforementioned pulsed oscillation laser, an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, and the like can be used. Note that although it is preferable that a pulsed laser beam be used for partial melting, an embodiment of the invention to be disclosed is not limited thereto. That is, the use of a continuous wave laser beam (a CW laser beam) is not excluded. Note that, as examples of an oscillator of a continuous wave laser beam, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like can be given.

The wavelength of the laser beam needs to be a wavelength which is absorbed by the first single crystal semiconductor layer 120. The wavelength may be determined in consideration of the skin depth and the like of the laser beam. For example, the wavelength can be set in the range of greater than or equal to 250 nm and less than or equal to 700 nm. In addition, the energy density of the laser beam can be determined in consideration of the wavelength of the laser beam, the skin depth thereof, the thickness of the first single crystal semiconductor layer 120, and the like. For example, the energy density of the laser beam may be set in the range of greater than or equal to 300 $mJ/cm^2$ and less than or equal to 800 $mJ/cm^2$. Note that the aforementioned range of the energy density is one example in the case where the thickness of the first single crystal semiconductor layer 120 is set at approximately 200 nm and an oscillator of a XeCl excimer laser (the wavelength: 308 nm) is used as an oscillator of a pulsed laser beam.

The laser beam irradiation can be performed in an atmosphere including oxygen such as an air atmosphere or an inert atmosphere such as a nitrogen atmosphere. In the case of an inert atmosphere, the laser beam irradiation may be performed in an airtight chamber whose atmosphere is controlled. In the case where the chamber is not used, a nitrogen atmosphere can be formed by blowing an inert gas such as a nitrogen gas to the surface which is irradiated with the laser beam.

Note that the laser beam irradiation in an inert atmosphere such as a nitrogen atmosphere is more effective in improving flatness of the first single crystal semiconductor layer 120 than the laser beam irradiation in an air atmosphere. In addition, the inert atmosphere has higher effect of suppressing generation of cracks and ridges than the air atmosphere, and the applicable range of energy density for the laser beam is widened. Note that the laser beam irradiation may be performed in vacuum. In the case where the laser beam irradiation is performed in vacuum, the same effect as that in the case where the laser beam irradiation is performed in an inert atmosphere can be obtained.

Note that in this embodiment although an example where treatment for repairing defects, treatment for flattening a surface, and the like are performed by the laser beam irradiation, an embodiment of the invention to be disclosed is not limited thereto. For example, the surface of the first single crystal semiconductor layer 120 may be subjected to etching treatment to remove defects, whereby flatness may be improved.

For example, polishing treatment, such as CMP (chemical mechanical polishing) may be applied instead of etching treatment.

In this manner, the semiconductor substrate having the first single crystal semiconductor layer 120 formed by being separated from the single crystal semiconductor substrate 110 can be manufactured. Note that, in the following description, the case where a semiconductor substrate which is not subjected to treatment for repairing defects and treatment for flattening a surface is used is described (see FIG. 1E).

Next, a first semiconductor layer 122A is epitaxially grown (vapor-phase growth or vapor-phase epitaxial growth) over the first single crystal semiconductor layer 120 (see FIG. 2A). That is, the first semiconductor layer 122A is a semiconductor layer which is influenced by the crystallinity of the first single crystal semiconductor layer 120. Here, a material of the first semiconductor layer 122A is selected in accordance with the first single crystal semiconductor layer 120. In the case of forming a silicon layer as the first semiconductor layer 122A, for example, the first semiconductor layer 122A is formed by a plasma CVD method using a mixed gas of a silane-based gas (typically, silane) and a hydrogen gas is used as a material. Further, the first semiconductor layer 122A is formed to have a thickness of greater than or equal to approximately 5 nm and less than or equal to approximately 100 nm, preferably, greater than or equal to approximately 10 nm and less than or equal to approximately 50 nm.

The aforementioned source gas is a mixed gas of a silane-based gas and hydrogen, which includes the hydrogen gas at a flow rate greater than or equal to 50 times, preferably greater than or equal to 100 times than that of the silane-based gas. For example, a mixed gas including 4 sccm of silane ($SiH_4$) and 400 sccm of hydrogen may be used. By increasing the flow rate of a hydrogen gas, a semiconductor layer having high crystallinity can be formed. Accordingly, the content of hydrogen in the semiconductor layer can be reduced.

Note that the silane-based gas is not limited to the aforementioned silane and disilane ($Si_2H_6$) or the like may be used. Further, a rare gas may be added to the aforementioned source gas.

Other conditions in the case where the first semiconductor layer 122A is formed by a plasma CVD method are as follows: the frequency is 10 MHz to 200 MHz; the electric power is greater than or equal to 5 W and less than or equal to 50 W; the pressure in the chamber is greater than or equal to 10 Pa and less than or equal to $10^3$ Pa; the electrode interval (in the case of a parallel-plate type) is greater than or equal to 15 mm and less than or equal to 30 mm; the temperature of the supporting substrate 100 is higher than or equal to 200° C. and lower than or equal to 400° C.; and typically, they are 60 MHz, 15 W, 100 Pa, 20 mm, and 280° C., respectively. Note that the aforementioned forming condition is only an example and an embodiment of the invention to be disclosed should not be construed as being limited thereto. Here, what is important is to form a semiconductor layer having high crystallinity (or a semiconductor layer having low hydrogen concentration or with a low hydrogen content) as the first semiconductor layer 122A. Therefore, as long as this object can be achieved, any formation method can be employed in formation of the first semiconductor layer 122A.

Note that before the epitaxial growth of the first semiconductor layer 122A, it is preferable to remove a native oxide layer or and the like formed over the surface of the first single crystal semiconductor layer 120. This is because when an oxide layer exists over the first single crystal semiconductor layer 120, epitaxial growth influenced by the crystallinity of the first single crystal semiconductor layer 120 cannot proceed and the crystallinity of the first semiconductor layer 122A is reduced. Here, the aforementioned oxide layer can be removed using a hydrofluoric acid based solution or the like.

Figure 2B:
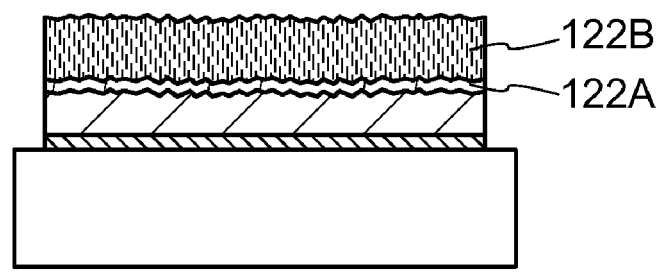

Next, a second semiconductor layer 122B is formed over the first semiconductor layer 122A (see FIG. 2B). Here, a material for the second semiconductor layer 122B is selected in accordance with the first semiconductor layer 122A. Further, the second semiconductor layer 122B is formed to a thickness of greater than or equal to 200 nm (preferably, greater than or equal to 400 nm). In this case, it is also preferable to remove an oxide layer formed over the surface of the first semiconductor layer 122A.

The second semiconductor layer 122B has lower crystallinity than the first semiconductor layer 122A. Alternatively, the second semiconductor layer 122B has a higher hydrogen concentration (a semiconductor layer including a higher hydrogen content) than the first semiconductor layer 122A. As the second semiconductor layer 122B, for example, an amorphous semiconductor layer may be formed.

Although any method is employed for formation of the second semiconductor layer 122B, it is preferable that the second semiconductor layer 122B be formed in a condition with a higher deposition rate than at least that of the first semiconductor layer 122A. For example, in the case where the second semiconductor layer 122B is formed by a plasma CVD method using a mixed gas of a silane-based gas (typically, silane) and a hydrogen gas as a material, the mixed gas may include a hydrogen gas at a flow rate greater than or equal to 2 times and less than or equal to 20 times (preferably greater than or equal to 5 times and less than or equal to 15 times) that of a silane-based gas. Further, the following conditions are preferable: the frequency is 10 MHz to 200 MHz; the electric power is greater than or equal to 5 W and less than or equal to 50 W; the pressure in the chamber is greater than or equal to 10 Pa and less than or equal to 103 Pa; the electrode interval (in the case of a parallel-plate type) is greater than or equal to 15 mm and less than or equal to 30 mm; and the temperature of the supporting substrate is higher than or equal to 200° C. and lower than or equal to 400° C. Typically, the flow rate of silane ($SiH_4$) is 25 sccm, the flow rate of hydrogen is 150 sccm, the frequency is 27 MHz, the electric power is 30 W, the pressure is 66.6 Pa, the electrode interval is 25 mm, and the temperature of the substrate is 280° C. Note that the above forming conditions are only an example and an embodiment of the invention to be disclosed should not be construed as being limited thereto. Here, what is important here is to form a semiconductor layer at a high deposition rate as the first semiconductor layer 122B even if the crystallinity thereof is low (or even when the hydrogen concentration thereof is high). Therefore, as long as this object is achieved, any formation method can be employed in formation of the second semiconductor layer 122B.

Figure 2C:
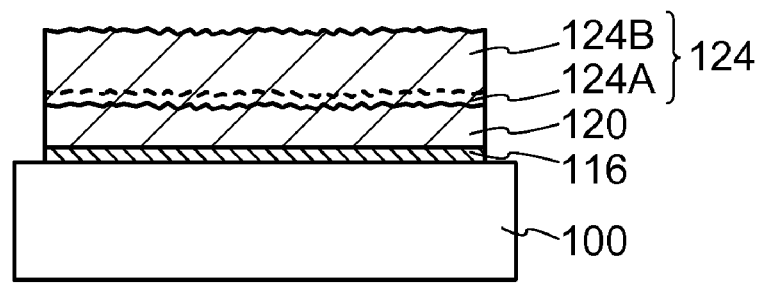

After that heat treatment is performed and a second single crystal semiconductor layer 124 is formed by solid-phase epitaxial growth (solid-phase growth) (see FIG. 2C). Note that the first semiconductor layer 122A and the second semiconductor layer 122B correspond to a lower region 124A and an upper region 124B of the second single crystal semiconductor layer 124, respectively.

The aforementioned heat treatment can be performed using a heat treatment apparatus such as a rapid thermal anneal (RTA), a furnace, a millimeter wave heating device, or the like. As a heating method of the heat treatment apparatus, a resistance heating method, a lamp heating method, a gas heating method, a radio wave heating method, and the like can be given. Laser beam irradiation or thermal plasma jet irradiation may be performed.

In general, a furnace is an external heating method, and the inside of the chamber and an object to be processed are in a thermal equilibrium state. On the other hand, RTA is an apparatus in which instantaneous heating (rapid heating) is performed by adding energy directly to the object to be processed and the inside of the chamber and the object to be processed are in a thermal nonequilibrium state. As the RTA apparatus, an RTA apparatus employing a lamp heating method (lamp rapid thermal anneal (LRTA) apparatus), an RTA apparatus employing a gas heating method which uses a heated gas (gas rapid thermal anneal (GRTA) apparatus), an RTA apparatus employing both a lamp heating method and a gas heating method, and the like can be given.

When the RTA apparatus is used, it is preferable that the process temperature be higher than or equal to 500° C. and lower than or equal to 750° C. and the process time be longer than or equal to 0.5 minute and shorter than or equal to 10 minutes. When a furnace is used, it is preferable that the process temperature be higher than or equal to 500° C. and lower than or equal to 600° C. and the process time be longer than or equal to 1 hour and shorter than or equal to 4 hours. Needless to say, the process temperature and the process time are not limited thereto as long as, for example, the allowable temperature of the supporting substrate 100 is higher than the maximum temperature of the process.

In this manner, a stacked structure of the first single crystal semiconductor layer 120 and the second single crystal semiconductor layer 124 is formed. Here, in order that the second single crystal semiconductor layer 124 is formed thick (for example, greater than or equal to 500 nm), use of only a vapor-phase growth method is undesirable in view of the deposition rate. On the other hand, in the case where the second single crystal semiconductor layer 124 is formed using only a solid-phase growth method, a problem relating to peeling of the semiconductor layer due to heat treatment arises. It is considered that a high content of hydrogen in the semiconductor layer which has just been formed (for example, an amorphous semiconductor layer) causes the peeling of the semiconductor layer.

In this embodiment, the first semiconductor layer 122A (a semiconductor having high crystallinity or having low hydrogen concentration, or a semiconductor layer formed by a method with a high deposition rate) is formed thin by vapor-phase growth. Then the second semiconductor layer 122B (a semiconductor layer having low crystallinity or having high hydrogen concentration, or a semiconductor layer formed by a method at with high deposition rate) is formed thick, and then solid-phase growth is performed to form the second single crystal semiconductor layer 124. Accordingly, the problem relating to peeling of the semiconductor layer can be solved while the deposition rate is kept. That is, a single crystal semiconductor layer having a predetermined thickness can be formed with high productivity and a high yield.

In this manner, the stacked structure of the semiconductor layers having high crystallinity and low crystallinity is formed over the single crystal semiconductor layer and then solid-phase growth is performed, whereby the problem relating to peeling is reduced. This is because a difference in crystallinity between the adjacent layers is reduced and bonding at an interface is strengthened and adhesion is enhanced.

Note that although the semiconductor layer having high crystallinity (the first semiconductor layer 122A) is formed between the single crystal semiconductor layer (the first single crystal semiconductor layer 120) and the semiconductor layer having low crystallinity (the second semiconductor layer 122B) in this embodiment, an embodiment of the invention to be disclosed is not limited thereto in considering the aforementioned reason. That is, a plurality of semiconductor layers which differ in crystallinity from each other may be provided between the single crystal semiconductor layer and the semiconductor layer having low crystallinity. For example, a semiconductor layer having high crystallinity is formed over the single crystal semiconductor layer; a semiconductor layer having slightly high crystallinity is formed thereover; and a semiconductor layer having low crystallinity is formed thereover. With such a structure, adhesion can be improved.

Further, in terms of adhesive strength at an interface, the aforementioned stacked structure is formed so as not to be exposed to the air as much as possible. For example, the first semiconductor layer 122A and the second semiconductor layer 122B may be successively formed in the same chamber.

Thus, the semiconductor substrate having the single crystal semiconductor layer which is thickened can be manufactured. Note that, in this embodiment, since flattening treatment is not performed on the surface of the first single crystal semiconductor layer 120, a surface of the second single crystal semiconductor layer 124 is strongly influenced by the surface of the first single crystal semiconductor layer 120. Therefore, if necessary, the surface of the second single crystal semiconductor layer 124 may be planarized.

Further, although this embodiment describes a method in which the first single crystal semiconductor layer 120 and the second single crystal semiconductor layer 124 are provided over the supporting substrate 100 with the insulating layer 116 interposed therebetween, an embodiment of the invention to be disclosed should not be construed as being limited thereto. For example, a layer having various functions (hereinafter, referred to as a functional layer) may be provided below the first single crystal semiconductor layer 120. For example, a layer including a conductive material, a layer including an impurity element (a semiconductor layer including an impurity element), or the like can be formed as the functional layer.

Next, a processing method of the single crystal semiconductor substrate 110 used in this embodiment is described with reference to FIGS. 3A to 3C.

First, the single crystal semiconductor substrate 110 is prepared (see FIG. 3A). As for the detail of the single crystal semiconductor substrate 110, the description of the manufacturing method of a semiconductor substrate (with reference to FIGS. 1A to 1F) can be referred to; therefore, the detail of the single crystal semiconductor substrate 110 is omitted here.

After cleaning the single crystal semiconductor substrate 110, an insulating layer 112 is formed over the surface of the single crystal semiconductor substrate 110. Although it is possible that a structure where the insulating layer 112 is not provided is employed, it is preferable to provide the insulating layer 112 so that the single crystal semiconductor substrate 110 is prevented from being contaminated and the surface of the single crystal semiconductor substrate 110 is prevented from being damaged in later ion introduction. The thickness of the insulating layer 112 is preferably greater than or equal to 10 nm and less than or equal to 400 nm.

As a material used to form the insulating layer 112, silicon oxide, silicon nitride, silicon oxynitride, silicon nitride oxide or the like can be used. The insulating layer 112 can be formed by a CVD method, a sputtering method, a method using oxidation (or nitridation) of the single crystal semiconductor substrate 110, or the like.

Next, the single crystal semiconductor substrate 110 is irradiated with an ion beam 140 including ions accelerated by an electric field through the insulating layer 112, thereby forming the damaged region 114 in a region at a predetermined depth from the surface of the single crystal semiconductor substrate 110 (see FIG. 3B). The depth of the region where the damaged region 114 is formed can be controlled by the accelerating energy of the ion beam 140 and the incidence angle thereof. The damaged region 114 is formed at a depth the same or substantially the same as the average penetration depth of ions.

The thickness of the single crystal semiconductor layer which is to be separated from the single crystal semiconductor substrate 110 is determined depending on the aforementioned depth at which the damaged region 114 is formed. The depth at which the damaged region 114 is formed is less than or equal to 500 nm, preferably less than or equal to 400 nm, and more preferably greater than or equal to 50 nm and less than or equal to 300 nm from the surface of the single crystal semiconductor substrate 110. By forming the damaged region 114 at a shallow depth, since the single crystal semiconductor substrate remains thick after separation, the number of times of reuse of the single crystal semiconductor substrate can be increased. Note that in the case where the damaged region 114 is formed at a shallow depth, accelerating voltage is set to be low; therefore, productivity or the like needs to be considered.

The aforementioned ion irradiation can be performed using an ion doping apparatus or an ion implantation apparatus. In an ion implantation apparatus, a source gas is excited to generate ion species, the produced ion species are mass-separated, and an object to be processed is irradiated with the ion species having a predetermined mass. In an ion doping apparatus, a process gas is excited to generate ion species, the produced ion species are not mass-separated, and an object to be processed is irradiated with the ion species generated. Note that, by using an ion doping apparatus provided with a mass separation mechanism, ion irradiation with mass separation can be performed in a similar manner to the ion implantation apparatus.

An ion irradiation step in the case of using an ion doping apparatus can be performed under the following conditions, for example:

Accelerating voltage is greater than or equal to 10 kV and less than or equal to 100 kV (preferably greater than or equal to 30 kV and less than or equal to 80 kV)

Dose is greater than or equal to $1 \times 10^{16}/cm^2$ and less than or equal to $4 \times 10^{16}/cm^2$.

Beam current density is higher than or equal to $2 \mu A/cm^2$ (preferably, higher than or equal to $5 \mu A/cm^2$, and more preferably, higher than or equal to $10 \mu A/cm^2$)

In the case of using an ion doping apparatus, a gas including hydrogen can be used as a source gas for an ion irradiation step. With the gas including hydrogen, $H^+$, $H_2^+$, and $H_3^+$ can be produced as ion species. In the case where a hydrogen gas is used as a source gas, it is preferable to perform irradiation with a larger amount of $H_3^+$ ions. Specifically, for example, it is preferably that the ion beam 140 include $H_3^+$ ions at a proportion of 70% or higher with respect to the total number of $H^+$, $H_2^+$, and $H_3^+$ ions. It is more preferable that the proportion of $H_3^+$ ions be higher than or equal to 80%. By increasing the proportion of $H_3^+$ included in the ion beam 140, the damaged region 114 can include hydrogen at a concentration of higher than or equal to $1 \times 10^{20}$ atoms/cm$^3$. Accordingly, separation at the damaged region 114 can be performed easily. By using a large amount of $H_3^+$ ions, ion irradiation efficiency is improved as compared to the case of using $H^+$ ions and/or $H_2^+$ ions. In other words, time required for ion irradiation can be shortened. Note that although the case of using a large amount of $H_3^+$ ions is described here, there is no problem even when the proportion of $H^+$ ions and/or $H_2^+$ ions is higher.

When the ion implantation apparatus is used, it is preferable to implant $H_3^+$ ions through mass-separation. Needless to say, $H^+$ ions or $H_2^+$ ions may be implanted. Note that, in the case of using an ion implantation apparatus, efficiency of the ion irradiation may be reduced as compared to the case of using an ion doping apparatus. This is because ion species are selectively implanted by an ion implantation apparatus.

As a source gas for the ion irradiation step, as well as a gas including hydrogen, one or more kinds of gases selected from a rare gas such as helium or argon; a halogen gas typified by a fluorine gas or a chlorine gas; and a halogen compound gas such as a fluorine compound gas (for example, $BF_3$) can be used. When helium is used for a source gas, the ion beam 140 with a high proportion of $He^+$ ions can be formed without mass separation. With the use of such an ion beam 140, the damaged region 114 can be efficiently formed.

Alternatively, an ion irradiation step can be performed plural times to form the damaged region 114. In this case, either different source gases or the same source gas may be used for the ion irradiation steps. For example, ion irradiation can be performed using a gas including hydrogen as a source gas after ion irradiation is performed using a rare gas as a source gas. Alternatively, first, ion irradiation can be performed using a halogen gas or a halogen compound gas, and then ion irradiation can be performed using a gas including hydrogen.

After formation of the aforementioned damaged region 114, the insulating layer 112 is removed and the insulating layer 116 is formed (see FIG. 3C). The surface of the insulating layer 116 preferably has high flatness since the insulating layer 116 is a layer for bonding. As such an insulating layer 116, a silicon oxide layer formed by a chemical vapor deposition method using an organosilane gas can be used, for example. Alternatively, a silicon nitride layer may be formed.

The insulating layer 112 is removed here because the insulating layer 112 is highly likely to be damaged by the aforementioned ion irradiation. Therefore, in the case where damage to the insulating layer 112 due to the ion irradiation does not become a problem, the insulating layer 116 may be formed over the insulating layer 112. Alternatively, the insulating layer 112 can also be used as the insulating layer 116.

In this manner, the semiconductor substrate illustrated in FIG. 1B can be obtained.

Embodiment 2

This embodiment describes an example of a processing method of a single crystal semiconductor substrate in which a conductive layer functioning as an electrode (or a wiring) is provided below a first single crystal semiconductor layer, with reference to FIGS. 4A to 4D. Note that the details of the same description as Embodiment 1 is omitted.

Figure 4A:
FIGS. 4A to 4D illustrate a manufacturing process of a semiconductor substrate.

First, a single crystal semiconductor substrate 110 is prepared (see FIG. 4A). The description of Embodiment 1 can be referred to for details of the single crystal semiconductor substrate 110; therefore, the description thereof is omitted here.

After cleaning the single crystal semiconductor substrate 110, an insulating layer 112 is formed over a surface of the single crystal semiconductor substrate 110. Details of the insulating layer 112 are also similar to those of Embodiment 1.

Figure 4B:
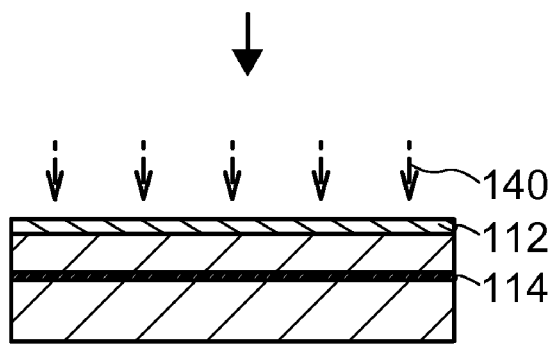

Next, the single crystal semiconductor substrate 110 is irradiated with an ion beam 140 including ions accelerated by an electric field through the insulating layer 112, thereby forming a damaged region 114 in a region at a predetermined depth from the surface of the single crystal semiconductor substrate 110 (see FIG. 4B). For the detailed description, Embodiment 1 can be referred to.

Figure 4C:

After formation of the aforementioned damaged region 114, the insulating layer 112 is removed and a conductive layer 118 is formed (see FIG. 4C). The conductive layer 118 needs to resist heat treatment in a later step. Therefore, the conductive layer 118 is preferably formed using a high melting point metal material. For example, titanium, molybdenum, tungsten, tantalum, chromium, or nickel can be used. Needless to say, a low resistant material, such as aluminum or copper, may be used to form the conductive layer 118. Further, a stacked structure of any of the above metal materials and a nitride thereof may be employed. For example, a stacked structure of a titanium nitride layer and a titanium layer, a stacked structure of a tantalum nitride layer and a tantalum layer, a stacked structure of a tungsten nitride layer and a tungsten layer, and the like can be used. Note that the conductive layer 118 can be formed by an evaporation method or a sputtering method. Further, when the conductive layer 118 is used as an electrode (or a wiring), the thickness thereof is preferably set at greater than or equal to 100 nm.

Figure 4D:
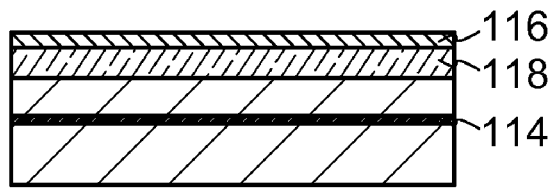

Next, an insulating layer 116 is formed over the conductive layer 118 (see FIG. 4D). A surface of the insulating layer 116 preferably has high flatness since the insulating layer 116 is a layer for bonding. As such an insulating layer 116, a silicon oxide layer formed by a chemical vapor deposition method using an organosilane gas can be used, for example. Alternatively, a silicon nitride layer may be used.

Steps after formation of the insulating layer 116 is the same as those of Embodiment 1 (see FIGS. 1A to 1E and FIGS. 2A to 2C).

Note that FIGS. 4A to 4D illustrate the case as follows: the insulating layer 112 is formed over the single crystal semiconductor substrate 110 and ion irradiation is performed to form the damaged region 114, the insulating layer 112 is removed, and then the conductive layer 118 and the insulating layer 116 are formed. However, an embodiment of the invention to be disclosed is not limited thereto.

For example, the following is possible: a conductive layer is formed over a surface of a single crystal semiconductor substrate; a surface of the conductive layer is irradiated with ions to form a damaged region at a predetermined depth in the single crystal semiconductor substrate; and then an insulating layer is formed over the conductive layer. In this manner, when the conductive layer is formed before the ion irradiation, the conductive layer can function as a protective layer, and the insulating layer 112 needs to be provided separately, which leads reduction of steps.

As described above, the semiconductor substrate having the conductive layer functioning as the electrode (or the wiring) below the single crystal semiconductor layer can be provided. Note that the aforementioned conductive layer is not limited to having a function of the electrode (or the wiring). For example, the conductive layer may be used as a light-shielding layer using its light-shielding function. Further, in a similar manner to that of formation of the conductive layer, a semiconductor layer including an impurity element may be formed. This embodiment can be used in combination with Embodiment 1.

Embodiment 3

This embodiment describes a processing method of a single crystal semiconductor substrate in which a stacked structure of an impurity semiconductor region (a first impurity semiconductor region) and a conductive layer is formed, with reference to FIGS. 5A to 5E. Note that details which are the same as Embodiment 1 is omitted.

Figure 5A:
FIGS. 5A to 5E illustrate a manufacturing process of a semiconductor substrate.

First, a single crystal semiconductor substrate 110 is prepared (see FIG. 5A). The description of Embodiment 1 can be referred to for details of the single crystal semiconductor substrate 110; therefore, the description thereof is omitted here.

After cleaning the single crystal semiconductor substrate 110, an insulating layer 112 is formed on a surface of the single crystal semiconductor substrate 110. Details of the insulating layer 112 are also similar to Embodiment 1.

Figure 5B:
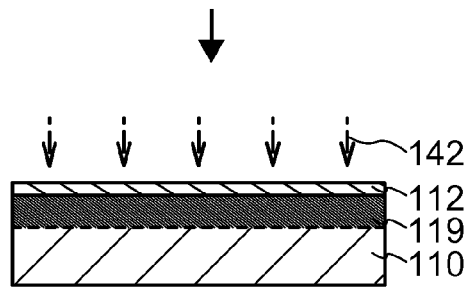

Next, an impurity element imparting one conductivity type is added to the single crystal semiconductor substrate 110 to form a first impurity semiconductor region 119 (see FIG. 5B). Note that since the insulating layer 112 is formed over the single crystal semiconductor substrate 110, the impurity element imparting one conductivity type is added to the single crystal semiconductor substrate 110 through the insulating layer 112. Here, the thickness of the first impurity semiconductor region 119 is greater than or equal to 30 nm and less than or equal to 200 nm, preferably greater than or equal to approximately 50 nm and less than or equal to approximately 100 nm.

As the impurity element imparting one conductivity type, for example, phosphorus or the like is used. In this manner, the n-type first impurity semiconductor region 119 can be formed. Needless to say, with the use of boron or the like, the p-type first impurity semiconductor region 119 may be formed. Note that the case where the first impurity semiconductor region 119 is formed by irradiation with an ion beam 142 is described, an embodiment of the invention to be disclosed is not limited thereto. For example, the first impurity semiconductor region 119 may be formed by a thermal diffusion method. However, since a high temperature treatment of approximately 900° C. or more is performed in a thermal diffusion method, the first impurity semiconductor region 119 needs to be formed by a thermal diffusion method before formation of a damaged region. Alternatively, with the use of a single crystal semiconductor substrate to which an impurity element imparting one conductivity type has been added in advance, the aforementioned addition of the impurity element may be omitted.

Note that, the concentration of the impurity element is not limited and, for example, may be a concentration of greater than or equal to approximately $1 \times 10^{19}$ atoms/cm$^3$ and less than or equal to approximately $5 \times 10^{21}$ atoms/cm$^3$. Further, the first impurity semiconductor region 119 formed by the aforementioned method is substantially a single crystal semiconductor.

Figure 5C:
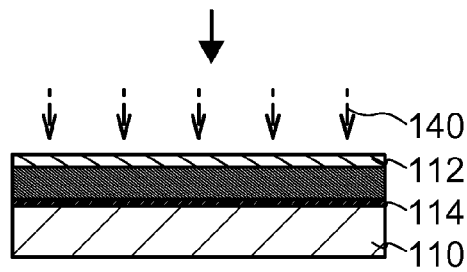

Next, the single crystal semiconductor substrate 110 is irradiated with an ion beam 140 including ions accelerated by an electric field through the insulating layer 112, thereby forming the damaged region 114 in a region at a predetermined depth from the surface of the single crystal semiconductor substrate 110 (a surface of the first impurity semiconductor region 119) (see FIG. 5C). For the detailed description, Embodiment 1 can be referred to.

Figure 5D:
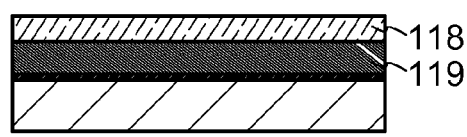

After formation of the aforementioned damaged region 114, the insulating layer 112 is removed and a conductive layer 118 is formed (see FIG. 5D). The conductive layer 118 needs to resist heat treatment in a later step. Therefore, the first conductive layer 118 is preferably formed using a high melting point metal material. For example, titanium, molybdenum, tungsten, tantalum, chromium, nickel, or the like can be used. Further, a stacked structure of any of the above metal materials and a nitride thereof can be employed. For example, a stacked structure of a titanium nitride layer and a titanium layer, a stacked structure of a tantalum nitride layer and a tantalum layer, a stacked structure of a tungsten nitride layer and a tungsten layer, and the like can be used. Note that the conductive layer 118 can be formed by an evaporation method or a sputtering method. Further, when the conductive layer 118 is used as an electrode (or a wiring), the thickness thereof is preferably set at greater than or equal to 100 nm.

Figure 5E:
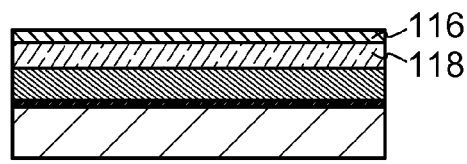

Next, an insulating layer 116 is formed over the conductive layer 118 (see FIG. 5E). A surface of the insulating layer 116 preferably has high flatness since the insulating layer 116 is a layer for bonding. As such an insulating layer 116, a silicon oxide layer formed by a chemical vapor deposition method using an organosilane gas can be used, for example. Alternatively, a silicon nitride layer may be used.

Note that, in FIGS. 5A to 5E, the following case is illustrated: the insulating layer 112 is formed over the single crystal semiconductor substrate 110; the impurity element imparting one conductivity type is added to the single crystal semiconductor substrate 110 to form the first impurity semiconductor region 119; ion irradiation is performed, thereby forming the damaged region 114; the insulating layer 112 is removed; and then the conductive layer 118 and the insulating layer 116 are formed. However, an embodiment of the invention to be disclosed is not limited thereto.

For example, any of the following methods can be employed.

(1) An insulating layer is formed over a surface of a single crystal semiconductor substrate; the single crystal semiconductor substrate is irradiated with ions through the insulating layer, thereby forming a damaged region in a region at a predetermined depth of the single crystal semiconductor substrate; and then irradiation with an impurity element imparting one conductivity type is performed to form a first impurity semiconductor region. Then, the insulating layer is removed, a conductive layer is formed over the first impurity semiconductor region, and an insulating layer is formed over the conductive layer. In this case, the single crystal semiconductor substrate, to which an impurity element is not added, is irradiated with ions to form the damaged region; therefore, variation in the damaged region can be reduced.

(2) A conductive layer is formed over a surface of a single crystal semiconductor substrate. The single crystal semiconductor substrate is irradiated with an impurity element imparting one conductivity type through the conductive layer. Further, the single crystal semiconductor substrate is irradiated with ions through the conductive layer, thereby forming a damaged region in a region at a predetermined depth of the single crystal semiconductor substrate, and then an insulating layer is formed over the conductive layer. In this case, the conductive layer functions as a protective layer. Therefore, an insulating layer functioning as a protective layer does not need to be provided, which leads to reduction of steps.

(3) A conductive layer is formed over a surface of a single crystal semiconductor substrate. After the single crystal semiconductor substrate is irradiated with ions through the conductive layer to form a damaged region at a predetermined depth of the single crystal semiconductor substrate, irradiation with an impurity element imparting one conductivity type is performed, thereby forming a first impurity semiconductor region. Then, an insulating layer is formed over the conductive layer. Also the conductive layer functions as a protective layer in this case. Therefore, an insulating layer functioning as a protective layer does not need to be provided, which leads to reduction of steps.

As described above, the single crystal semiconductor substrate having the stacked structure of the impurity semiconductor region (the first impurity semiconductor region) and the conductive layer can be formed. This embodiment can be combined with Embodiment 1 or 2 as appropriate.

Embodiment 4

This embodiment describes an example of a method for manufacturing a semiconductor substrate which can be used for a semiconductor device, with reference to FIGS. 6A to 6F and FIGS. 7A to 7C. Note that in this embodiment, the single crystal semiconductor substrate formed in Embodiment 3 is used. Further, in the following description, details of parts which are the common with those in Embodiment 1 to Embodiment 3 are omitted.

First, a supporting substrate 100 is prepared (see FIG. 6A). Embodiment 1 can be referred to for the details of the supporting substrate 100.

Next, a single crystal semiconductor substrate 110 is prepared (see FIG. 6B). The single crystal semiconductor substrate 110 prepared here is subjected to the processing described in Embodiment 3. That is, the single crystal semiconductor substrate 110 is provided with a damaged region 114, a first impurity semiconductor region 119, a conductive layer 118, and an insulating layer 116.

Then, the aforementioned supporting substrate 100 and the single crystal semiconductor substrate 110 are bonded to each other (see FIG. 6C). Specifically, after cleaning the surfaces of the supporting substrate 100 and the insulating layer 116 by a method such as ultrasonic cleaning, the surface of the supporting substrate 100 and the surface of the insulating layer 116 are disposed to be in contact with each other. Then, pressure treatment is performed so that the surface of the supporting substrate 100 and the surface of the insulating layer 116 are bonded to each other. Embodiment 1 can be referred to for other details.

Next, the single crystal semiconductor substrate 110 is separated into a first impurity semiconductor layer 121 and a single crystal semiconductor substrate 130 at the damaged region 114 (see FIG. 6D). The separation of the single crystal semiconductor substrate 110 is caused by heat treatment. For the detailed description, Embodiment 1 can be referred to.

Defects due to the separation step and the ion introduction step exist on a surface of the first impurity semiconductor layer 121 formed as described above, and flatness of the surface of the first impurity semiconductor layer 121 is impaired (see FIG. 6E). Then, in this embodiment, treatment for repairing defects or treatment for flattening a surface is performed on the first impurity semiconductor layer 121. Note that if the treatment for repairing defects and the treatment for flattening a surface are not necessary, they may be omitted.

As the treatment for repairing defects or the treatment for flattening a surface, for example, laser beam irradiation can be employed. By irradiation with a laser beam from above the first impurity semiconductor layer 121, the upper portion of the first impurity semiconductor layer 121 is melted, and then is cooled and solidified, so that defects are repaired and flatness of the surface is improved. In the laser beam irradiation, heat treatment within the allowable temperature limit of the supporting substrate may also be performed. By heating the supporting substrate, defects can be reduced efficiently.

Note that the first impurity semiconductor layer 121 is partially melted by the laser beam irradiation. This is because, if the first impurity semiconductor layer 121 is completely melted, it is microcrystallized due to disordered nucleation after being in a liquid phase, so that the crystallinity of the first impurity semiconductor layer 121 is highly likely to decrease. On the contrary, by partial melting, crystal growth proceeds from a solid phase part, which is not melted. Accordingly, the defects of the semiconductor layer can be reduced. Note that the term "complete melting" here refers to that the first impurity semiconductor layer 121 is melted down to the vicinity of the lower interface of the first impurity semiconductor layer 121 to be made in a liquid phase. On the other hand, in this case, the term "partial melting" means that the upper part of the first impurity semiconductor layer 121 is melted to be made in a liquid phase while the lower part thereof is not melted and is still in a solid phase. Embodiment 1 can be referred to for other conditions and the like.

In this manner, the semiconductor substrate having the first impurity semiconductor layer 123 whose defects are repaired and whose surface is flattened can be manufactured (see FIG. 6F).

Next, a first semiconductor layer 122A is epitaxially grown (vapor-phase growth or vapor-phase epitaxial growth) over the first impurity semiconductor layer 123 (see FIG. 7A). That is, the first semiconductor layer 122A is a semiconductor layer which is influenced by the crystallinity of the first impurity semiconductor layer 123. Here, a material of the first semiconductor layer 122A is selected in accordance with the first impurity semiconductor layer 123. In the case of forming a silicon layer as the first semiconductor layer 122A, for example, the first semiconductor layer 122A is formed by a plasma CVD method using a mixed gas of a silane-base gas (typically, silane) and a hydrogen gas is used as a material. Note that an impurity element imparting the same conductivity type as that of the first impurity semiconductor layer 123 is preferably added to the aforementioned source gas. Needless to say, after formation of the first semiconductor layer 122A, the impurity element (impurity element imparting one conductivity type) may be added thereto. Although there is no particular limitation on the concentration of the impurity element in the first semiconductor layer 122A, the concentration of the impurity element in the first semiconductor layer 122A is preferably lower than that in the first impurity semiconductor layer 123, for example, may be greater than or equal to approximately $1 \times 10^{15}$ atoms/cm$^3$ and less than or equal to approximately $1 \times 10^{19}$ atoms/cm$^3$. Further, the first semiconductor layer 122A is formed to a thickness of greater than or equal to 5 nm and less than or equal to 100 nm, preferably greater than or equal to 10 nm and less than or equal to 50 nm.

The aforementioned source gas is a mixed gas including the hydrogen gas at a flow rate greater than or equal to 50 times, preferably greater than or equal to 100 times than that of the silane-based gas. For example, a mixed gas including 4 sccm of silane (SiH$_4$) and 400 sccm of hydrogen may be used. By increasing the flow rate of a hydrogen gas, a semiconductor layer having high crystallinity can be formed. Accordingly, the content of hydrogen in the semiconductor layer can be reduced. Details of conditions can be referred to the description described in Embodiment 1.

Next, a second semiconductor layer 122B is formed over the first semiconductor layer 122A (see FIG. 7B). Here, a material for the second semiconductor layer 122B is selected in accordance with the first semiconductor layer 122A. Further, an impurity element which is the same as that of the first semiconductor layer 122A is added to the second semiconductor layer 122B. The concentration of the impurity element is preferably about the same as that of the first semiconductor layer 122A. Further, the second semiconductor layer 122B is formed to a thickness of greater than or equal to 200 nm (preferably, greater than or equal to 400 nm).

The second semiconductor layer 122B has lower crystallinity than the first semiconductor layer 122A. Alternatively, the second semiconductor layer 122B has a higher hydrogen concentration (a semiconductor layer including a higher hydrogen content) than the first semiconductor layer 122A. As the second semiconductor layer 122B, for example, an amorphous semiconductor layer is formed. For the detailed description thereon, Embodiment 1 can be referred to.

After that, heat treatment is performed and by solid-phase epitaxial growth (solid-phase growth), a second impurity semiconductor layer 125 is formed (see FIG. 7C). Note that the first semiconductor layer 122A and the second semiconductor layer 122B correspond to a lower region 125A and an upper region 125B of the second impurity semiconductor layer 125, respectively. Further, the second impurity semiconductor layer 125 is substantially a single crystal semiconductor. Embodiment 1 also can also be referred to for the detail of the heat treatment.

In this manner, a stacked structure of the first impurity semiconductor layer 123 and the second impurity semiconductor layer 125 is formed. Here, in order that the second impurity semiconductor layer 125 is formed thick (for example, greater than or equal to 500 nm), use of only a vapor-phase growth method is undesirable in view of a deposition rate. On the other hand, in the case where the second impurity semiconductor layer 125 is formed using only a solid-phase growth method, a problem relating to peeling of the semiconductor layer due to heat treatment arises. It is considered that a high content of hydrogen in the semiconductor layer which has just been formed (for example, an amorphous semiconductor layer) causes the peeling of the semiconductor layer.

In this embodiment, the first semiconductor layer 122A (the semiconductor layer having high crystallinity or having low hydrogen concentration) is formed thin by vapor-phase growth. Then, the second semiconductor layer 122B (the semiconductor layer having low crystallinity or having high hydrogen concentration) is formed thick, and then solid-phase growth is performed, so that the second impurity semiconductor layer 125 is formed. Accordingly, the problem relating to peeling of the semiconductor layer can be solved while the deposition rate is kept. That is, an impurity semiconductor layer having a predetermined thickness can be formed with high productivity and a high yield. This embodiment can be combined with any of Embodiments 1 to 3 as appropriate.

Embodiment 5

This embodiment describes a structure of a power MOSFET as an example of a semiconductor device with reference to FIGS. 8A to 8D and FIGS. 9A and 9B. Note that this embodiment describes a case where a semiconductor substrate which is manufactured by the method of Embodiment 4 is used; however, an embodiment of the invention to be disclosed should not be construed as being limited thereto.

Figure 8A:
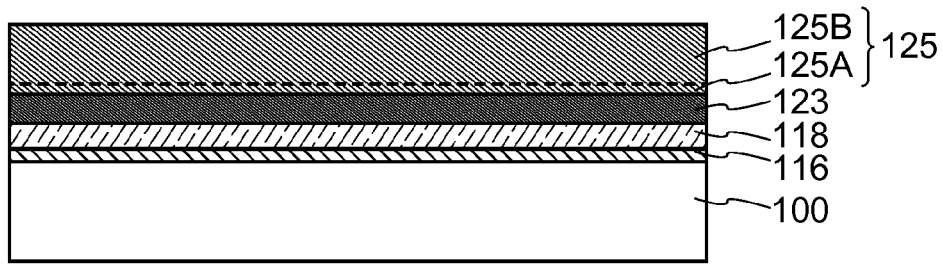
FIGS. 8A to 8D illustrate a manufacturing process of a semiconductor substrate.

First, a semiconductor substrate illustrated in FIG. 7C is prepared (see FIG. 8A). The semiconductor substrate has a structure in which an insulating layer 116, a conductive layer 118, a first impurity semiconductor layer 123, and a second impurity semiconductor layer 125 are successively formed over a supporting substrate 100. The thickness of the second impurity semiconductor layer 125 can be changed in accordance with a withstand voltage required for an element and, for example, is greater than or equal to 1 μm. Further, the impurity concentration of the second impurity semiconductor layer 125 is preferably set to be lower than that of the first impurity semiconductor layer 123.

Note that this embodiment employs a structure in which the conductive layer 118 is provided below a bottom surface of the first impurity semiconductor layer 123; however, an embodiment of the invention to be disclosed is not limited thereto and may employ a structure in which the conductive layer 118 is provided selectively. In the power MOSFET described in this embodiment, the conductive layer 118 functions as a drain electrode layer (or a source electrode layer). Further, the first impurity semiconductor layer 123 functions as a drain region (or a source region).

Figure 8B:
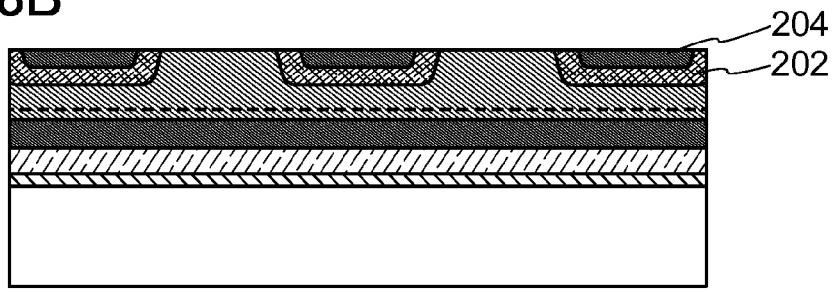
Figure 8C:
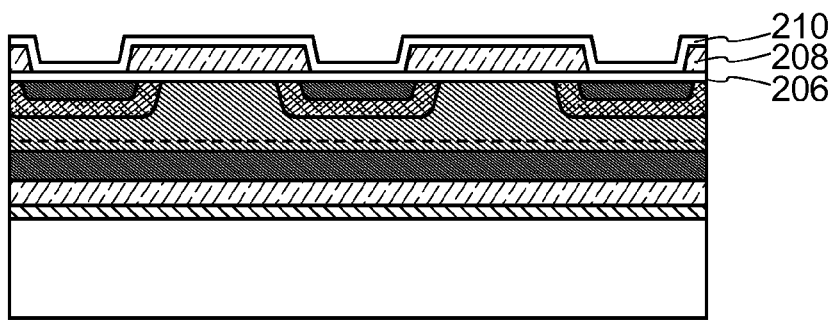

Next, an impurity element imparting p-type conductivity (for example, boron or the like) and an impurity element imparting n-type conductivity (for example, phosphorus or the like) are selectively added to the second impurity semiconductor layer 125, thereby forming a region 202 having a conductivity type different from that of the second impurity semiconductor layer and a region 204 having the same conductivity type as that of the second impurity semiconductor layer (see FIG. 8B). Here, part of the region 202 functions as a channel formation region later and the region 204 functions as a source region (or a drain region). Further, the impurity concentration of the region 204 is higher than that of the second impurity semiconductor layer.

After formation of the region 202 and the region 204, a gate insulating layer 206 is formed over the second impurity semiconductor layer 125, and a gate electrode layer 208 is selectively formed over the gate insulating layer 206. Then, an insulating layer 210 is formed so as to cover the gate electrode layer 208 (see FIG. 8C). Here, it is preferable that the gate electrode layer 208 be formed so that at least part of the gate electrode layer 208 overlaps with the region 204. Thus, the concentration of electric field is alleviated, whereby higher withstand voltage can be obtained.

The gate insulating layer 206 can be formed using a material, such as silicon oxide, silicon oxynitride, silicon nitride oxide, silicon nitride, hafnium oxide, aluminum oxide, and tantalum oxide. As examples of a forming method, a plasma CVD method, a sputtering method, oxidation or nitridation by high density plasma treatment, and the like can be given. Although the insulating layer 210 can be formed in a manner similar to the gate insulating layer 206, a material different from that of the gate insulating layer 206 may be used for the insulating layer 210. For example, an insulating material including an organic material can be used.

The gate electrode layer 208 can be formed in a manner similar to that of the conductive layer 118. That is, a metal material, such as titanium, molybdenum, tungsten, tantalum, chromium, nickel, aluminum, and copper, is preferably used for formation of the gate electrode layer 208. A stacked structure of the aforementioned metal material and nitride of the metal material may be applied.

Figure 8D:
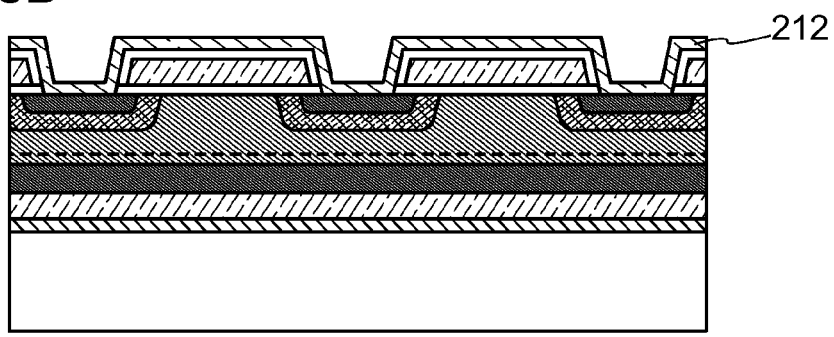

Next, after openings are formed in the insulating layer 210 and the gate insulating layer 206, a conductive layer 212 (a source electrode layer or a drain electrode layer) which is electrically connected to the region 204 is formed (see FIG. 8D). Note that the conductive layer 212 functions as a source wiring (or a drain wiring).

The openings in the insulating layer 210 and the gate insulating layer 206 can be formed by selective etching with the use of a mask. Further, the conductive layer 212 is formed in a manner similar to that of the conductive layer 118 or the gate insulating layer 208.

Figure 9A:
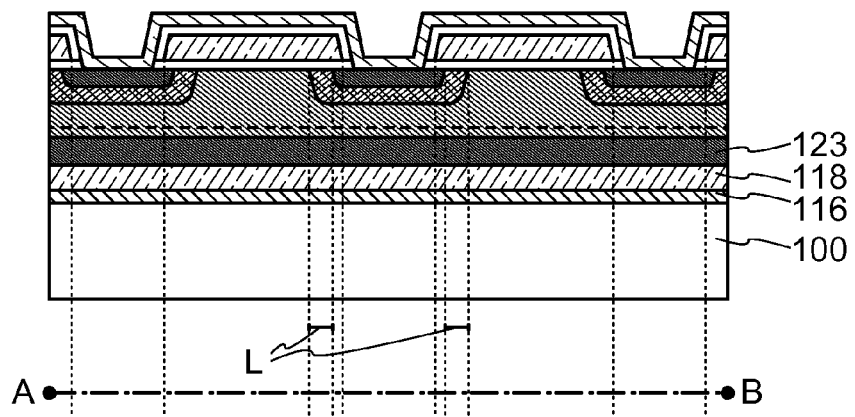
FIGS. 9A and 9B are a plan view and a cross sectional view of a semiconductor device, respectively.
Figure 9B:
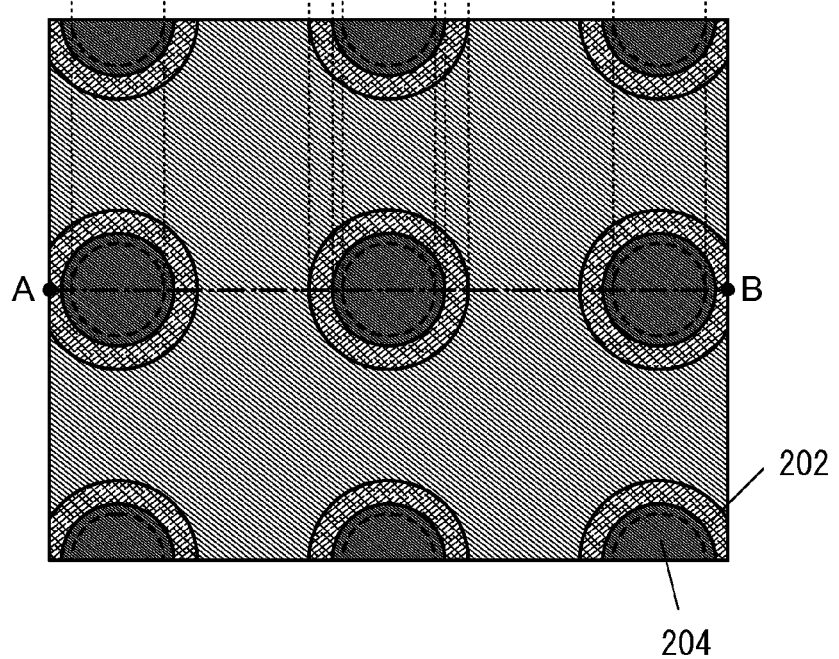

In this manner, a so-called power MOSFET can be manufactured. FIGS. 9A and 9B illustrate a relation between a plane view and a cross sectional view of the power MOSFET in this embodiment. FIGS. 9A and 9B are the plane view and the cross sectional view of the power MOSFET in this embodiment, respectively. Here, FIG. 9A corresponds to a cross section taken along a line A-B in FIG. 9B. Note that in FIG. 9B, part of components such as the gate insulating layer 206, the gate electrode layer 208, the insulating layer 210, and the conductive layer 212, are omitted for simplicity.

Further, a positional relation and a connection relation between layers are not limited to the structure illustrated in FIGS. 9A and 9B. For example, it is possible that part of the gate electrode layer 208 and the conductive layer 118 are electrically connected to each other, whereby the part of the gate electrode layer 208 can function as a wiring for the conductive layer 118.

Note that, the region 202 and the region 204 each have a circular shape (see FIG. 9B) in this embodiment; however, an embodiment of the invention to be disclosed is not limited thereto. Either a rectangular shape or any other shape can be employed. The region 202 and the region 204 are circular as described in this embodiment, whereby the channel length L can be uniform. Accordingly, the concentration of the electric field in the channel formation region can be alleviated, whereby the transistor can have higher withstand voltage. Further, the conductive layer 118 has an effect of improvement of efficiency in waste heat of a transistor with large current.

This embodiment can be combined with any of Embodiments 1 to 4 as appropriate.

Embodiment 6

This embodiment describes a method for manufacturing a semiconductor device using a semiconductor substrate manufactured by the method described in Embodiment 1 or the like with reference to FIGS. 10A to 10D and FIGS. 11A to 11D. In particular, this embodiment describes a case of manufacturing an n-channel FET and a p-channel FET which are used for a CMOS structure; however, a semiconductor element using the aforementioned semiconductor substrate is not particularly limited thereto. In addition, this embodiment describes a case of using a semiconductor substrate manufactured by a method based on Embodiment 1; however, an embodiment of the invention to be disclosed should not be construed as being limited thereto.

Figure 10A:
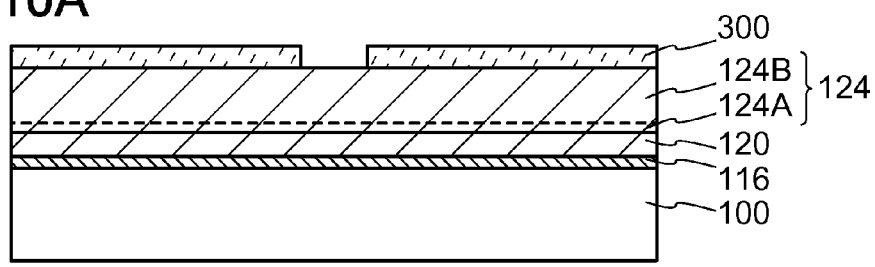
FIGS. 10A to 10D illustrate a manufacturing process of a semiconductor device.
Figure 10B:
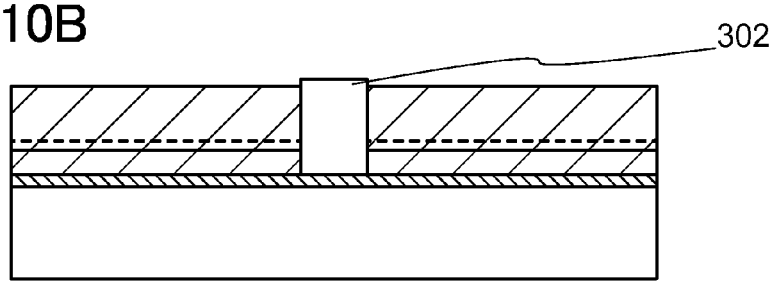

First, after the semiconductor substrate is obtained in accordance with Embodiment 1 or the like, a protective layer 300 which functions as a mask for formation of an element isolation insulating layer is formed over a second single crystal semiconductor layer 124 (see FIG. 10A). A silicon oxide film, a silicon nitride film, or the like is used as the protective layer 300. Note that the semiconductor substrate used in this embodiment is basically equivalent to a semiconductor substrate formed in accordance with Embodiment 1; however, the semiconductor substrate used in this embodiment differs from the semiconductor substrate formed in accordance with Embodiment 1 in that flattening treatment is performed on an interface between a single crystal semiconductor layer 120 and a second single crystal semiconductor layer 124 and a surface of the second single crystal semiconductor layer 124. Needless to say, in the case where flattening treatment is unnecessary, flattening treatment is not required to be performed. Alternatively, flattening treatment may be performed on either the interface between the single crystal semiconductor layer 120 and the second single crystal semiconductor layer 124 or the surface of the second single crystal semiconductor layer 124.

To control threshold voltages of the first single crystal semiconductor layer 120 and the second single crystal semiconductor layer 124, a p-type impurity such as boron, aluminum, or gallium or an n-type impurity such as phosphorus or arsenic may be added to the first single crystal semiconductor layer 120 and the second single crystal semiconductor layer 124. For example, as a p-type impurity, boron can be added at a concentration of from $5\times10^{17}$ to $1\times10^{18}$ cm$^{-3}$. Note that single crystal silicon is used as the aforementioned single crystal semiconductor layer in this embodiment.

Next, etching is performed using the protective layer 300 as a mask and exposed part of the second single crystal semiconductor layer 124 and part of the first single crystal semiconductor layer 120 are removed. Needless to say, part of an insulating layer 116 may also be removed or only the part of the second single crystal semiconductor layer 124 may be removed. After that, an insulating layer is deposited. The insulating layer can be a silicon oxide film, for example. In this case, the insulating layer may be formed by using any of a variety of film deposition techniques typified by a chemical vapor deposition method. The insulating layer is deposited thickly so as to be embedded in the second single crystal semiconductor layer 124.

Then, part of the insulating layer which overlaps with the single crystal semiconductor layer 124 is removed by polishing, etching, or the like. After the protective layer 300 is removed, an element isolation insulating layer 302 formed of part of the insulating layer is left (see FIG. 10B). Note that this embodiment employs a structure in which the element isolation insulating layer 302 is provided; however, an embodiment of the invention to be disclosed is not construed as being limited thereto and may employ a structure in which the element isolation insulating layer 302 is not provided.

Figure 10C:
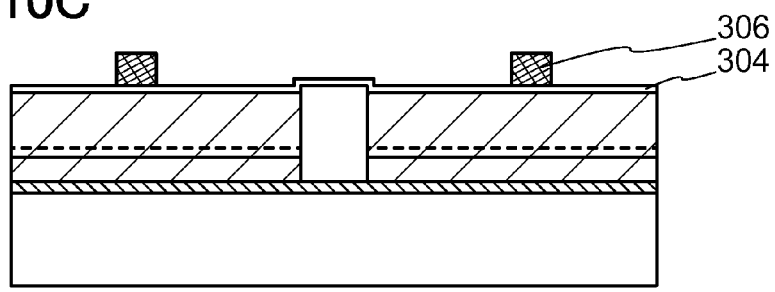
Figure 10D:
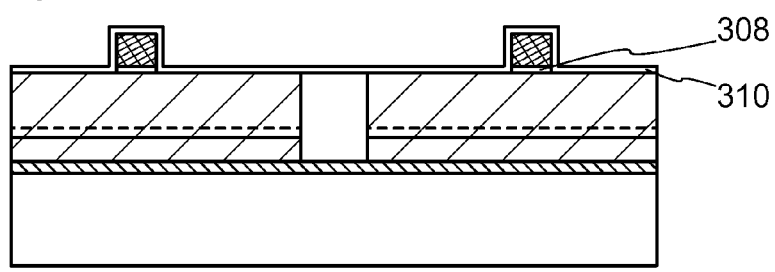

Next, an insulating layer 304 is formed and a gate electrode 306 is formed over the insulating layer 304 (see FIG. 10C). The insulating layer 304 functions as a gate insulating layer. The gate insulating layer 304 can be formed by a PECVD method, a sputtering method, or the like. It is preferable that the gate insulating layer 304 be formed using silicon oxide, silicon nitride oxide, silicon nitride, hafnium oxide, aluminum oxide, tantalum oxide, or the like. Note that the gate insulating layer 304 may have a single-layer structure or a stacked layer structure. Here, a silicon oxide film having a thickness of about 20 nm which covers the surface of the second single crystal semiconductor layer 124 with a single-layer structure is formed by a PECVD method.

As another formation method of the insulating layer 304, the surface of the second single crystal semiconductor layer 124 may be oxidized or nitrided by high-density plasma treatment. The high-density plasma treatment can be performed using, for example, a mixed gas of a rare gas such as He, Ar, Kr, or Xe, and a gas such as oxygen, nitrogen, hydrogen, nitrogen oxide, or ammonia. When excitation of the plasma in this case is performed by using a microwave, plasma with a low electron temperature and high density can be generated. The surface of the second single crystal semiconductor layer 124 is oxidized or nitrided with oxygen radical (including an OH radical) or a nitrogen radical (including an NH radical) in plasma, whereby an insulating layer having a thickness of greater than or equal to 1 nm and less than or equal to 50 nm (preferably, greater than or equal to 5 nm and less than or equal to 30 nm) can be formed over the surface of the second single crystal semiconductor layer 124.

Note that, in this embodiment, since the flattening treatment is performed on the second single crystal semiconductor layer 124, sufficient gate withstand voltage can be obtained even when an insulating layer having a thickness of about 20 nm is used.

A material having high heat resistance is preferably used for the gate electrode 306. For example, titanium, molybdenum, tungsten, tantalum, chromium, nickel, or the like can be used. Needless to say, the gate electrode 306 may be formed using a material having low resistance, such as aluminum and copper.

Note that in this embodiment, the gate electrode 306 employs a single-layer structure; however, a stacked layer structure of two or more layers may also be used. Further, combination of the aforementioned materials may be used. In this case, combination of a material having high heat resistance and a material having low resistance, for example, a stacked structure of titanium and aluminum, a stacked structure of tungsten and aluminum, or the like may be used. Further, a stacked structure of the aforementioned metal material and nitride of the metal material may be employed. For example, a stacked structure of a titanium nitride layer and a titanium layer, a stacked structure of a tantalum nitride layer and a tantalum layer, a stacked structure of a tungsten nitride layer and a tungsten layer, or the like can be employed. Note that the gate electrode 306 is formed using an evaporation method, a sputtering method, or the like.

Next, the insulating layer 304 is etched using the gate electrode 306 as a mask to form a gate insulating layer 308. In this etching, part of the element isolation insulating layer 302 is etched. After that, an insulating layer 310 covering the gate electrode 306 is formed (see FIG. 10D).

Next, part of a region which is to be an n-channel FET later is doped with phosphorous (P), arsenic (As), or the like at a low concentration to form a first impurity region 312, and part of a region which is to be a p-channel FET later is doped with boron (B) or the like at a low concentration to form a second impurity region 314 (see FIG. 11A). Note that although the impurity regions are formed after formation of the insulating layer 310 here, the impurity regions may be formed before the insulating layer 310 is formed.

After that, a sidewall insulating layer 316 and a sidewall insulating layer 318 are formed (see FIG. 11B). The sidewall insulating layer 318 of the region which is to be the p-channel FET is preferably larger in width than the sidewall insulating layer 316 of the region which is to be the n-channel FET.

Next, the insulating layer 310 is partly etched to expose a surface of the first impurity region 312 and a surface of the second impurity region 314. At this time, a top surface of the gate electrode 306 is also exposed. Then, part of the region which is to be the n-channel FET is doped with phosphorous (P), arsenic (As), or the like at a high concentration to form third impurity region 320, and part of the region which is to be the p-channel FET is doped with boron (B) or the like at a high concentration to form a fourth impurity region 322 (see FIG. 11C). Note that although the impurity regions are formed after the insulating layer 310 is partly etched here, the impurity regions may be formed before the insulating layer 310 is etched.

Next, an interlayer insulating layer 324 is formed and a contact plug 326 and a contact plug 328 which reach the third impurity region 320 and the fourth impurity region 322, respectively, are formed. As described above, an n-channel FET 330 and a p-channel FET 332 can be manufactured using the single crystal semiconductor layer provided over the supporting substrate 100 (see FIG. 11D).

The n-channel FET 330 and the p-channel FET 332 can be complementarily combined to form a CMOS structure. Further, a variety of semiconductor devices can be manufactured by using such a semiconductor element.

Note that in a partial depletion FET whose single crystal semiconductor layer (a single crystal silicon layer) has a thickness of greater than or equal to 300 nm, since a semiconductor (silicon) having higher thermal conductivity than that of an insulator exists in a bottom portion of a channel region which is formed when the transistor is on, even when heat is generated in the channel region due to large current, the heat can be diffused effectively. Accordingly, temperature change in the channel region and change in characteristics of the transistor are suppressed; therefore, the partial depletion FET is suitable for a device for large current. Further, when the thickness of the single crystal semiconductor layer (the single crystal silicon layer) is greater than or equal to 300 nm, formation of a bipolar transistor which operates at high speed is facilitated as well as formation of a FET.

This embodiment can be combined with any of Embodiments 1 to 5 as appropriate.

Example 1

Figure 12:
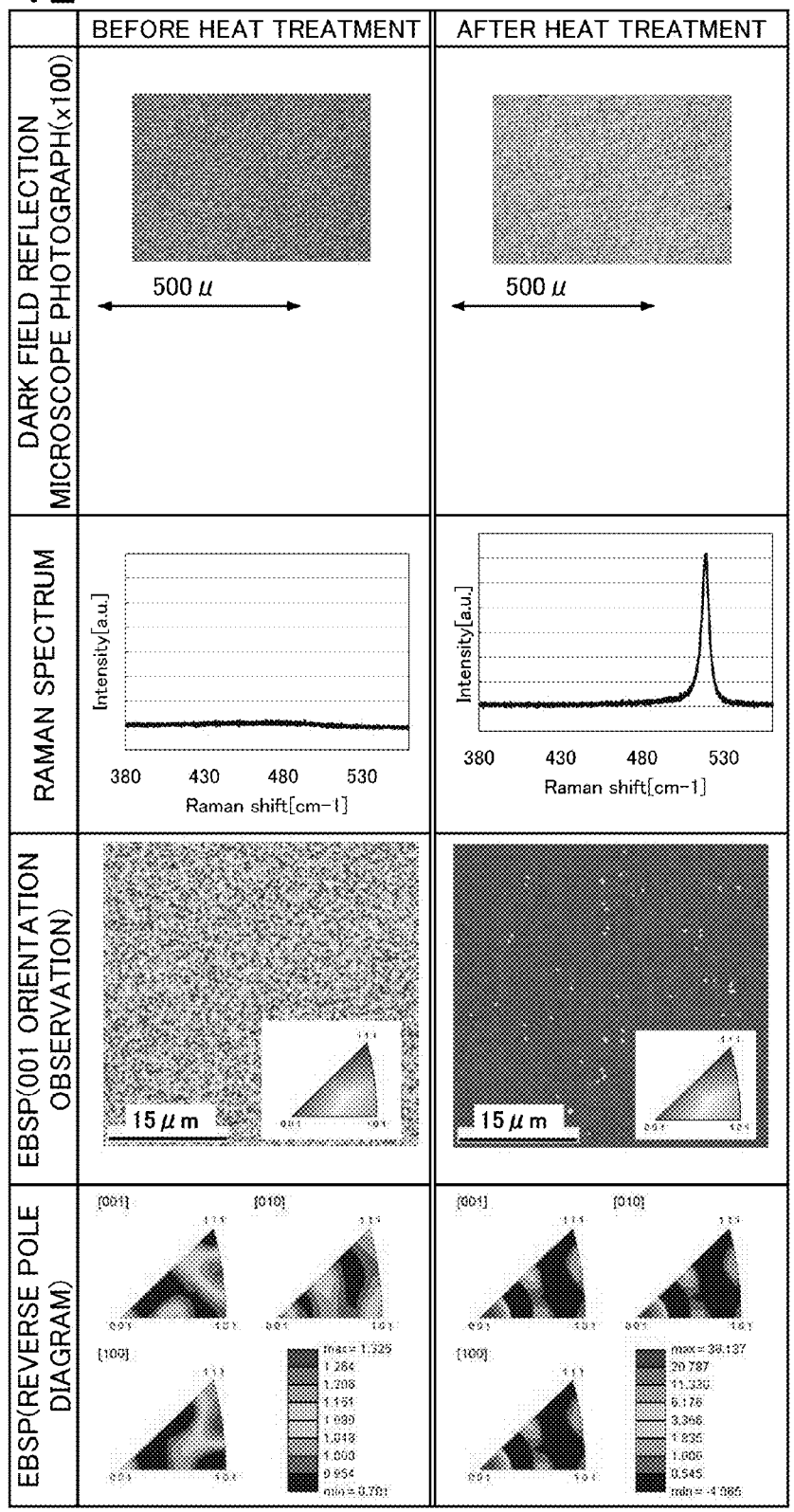
FIG. 12 shows observation results in Example.

This example describes characteristics of a single crystal silicon layer provided over a glass substrate by using a method which is an embodiment of the invention to be disclosed, with reference to FIG. 12.

First, a single crystal silicon layer was formed over a glass substrate using the method described in the aforementioned embodiments. In this example, a stacked structure of a silicon oxide layer having a thickness of 50 nm, a silicon nitride oxide layer having a thickness of 50 nm, and a single crystal silicon layer having a thickness of 120 nm was formed over a glass substrate having a thickness of 0.7 nm. After that, a silicon layer having high crystallinity and a silicon layer having low crystallinity were successively formed over the single crystal silicon layer.

The silicon layer having high crystallinity is formed under the following forming conditions:
Deposition method: plasma CVD
Source gas: silane (4 sccm)+hydrogen (400 sccm)
Electric power (frequency): 15 W (60 MHz)
Pressure: 100 Pa
Electrode interval: 20 mm
Temperature of the glass substrate: 280° C.
Thickness: 20 nm Further, the silicon layer having low crystallinity is formed under the following forming conditions:
Deposition method: plasma CVD
Source gas: silane (25 sccm)+hydrogen (150 sccm)
Electric power (frequency): 30 W (27 MHz)
Pressure: 66.6 Pa
Electrode interval: 25 mm
Temperature of the glass substrate: 280° C.
Thickness: 480 nm After the silicon layer having low crystallinity was formed, the characteristics of the silicon layer having low crystallinity were observed. Specifically, observation of a surface of the semiconductor layer using a microscope, observation of a Raman spectrum, and observation of EBSP (electron back scattering pattern) were conducted.

After that, by solid-phase growth (solid-phase epitaxial growth), single-crystallization was performed on the silicon layer having high crystallinity and the silicon layer having low crystallinity. Specifically, heat treatment was performed at 650° C. for 6 minutes using an RTA apparatus employing a gas heating method (GRTA: gas rapid thermal anneal) apparatus. Note that since the silicon layer having high crystallinity formed in this example has characteristics extremely close to those of single crystal silicon, the silicon layer having high crystallinity was not significantly changed by the aforementioned heat treatment. Needless to say, if the silicon layer having high crystallinity does not have characteristics close to those of single crystal silicon, single-crystallization is performed on the silicon layer having high crystallinity by solid-phase growth. Further, in this stage, peeling of the aforementioned silicon layer was not caused. After the aforementioned heat treatment, observation of the surface, observation of Raman spectrum, and observation of EBSP were conducted again.

Results of the aforementioned observations are shown in FIG. 12 in color together. A left column shows observation results before the heat treatment and a right column shows observation results after the heat treatment. From comparison between them, it is found that the characteristics of the silicon layer are significantly changed after the heat treatment. For example, a peak wavenumber of Raman spectrum after the heat treatment is 519.1 cm$^{-1}$ and the peak thereof is steep (the full width at half maximum is 5.33 cm$^{-1}$). Further, from EBSP observation, it is also found that crystals are sufficiently regular and thus single-crystallization is performed on the silicon layer substantially.

From the above observation results, it can be said that a semiconductor device having excellent characteristics can be provided using the method described in an embodiment of the invention to be disclosed.

Comparative Example

For comparison, a silicon layer having low crystallinity was formed directly on a single crystal silicon layer and heat treatment was performed thereon. Note that in this comparative example, a silicon layer having low crystallinity (its thickness: 500 nm) was used instead of a stacked structure of a silicon layer having high crystallinity and a silicon layer having low crystallinity; however, other conditions were the same as those in the aforementioned example.

As a result of the heat treatment, peeling of the silicon layer having low crystallinity was caused in this comparative example. This is because adhesion between the single crystal silicon layer and the silicon layer having low crystallinity is low. Effectiveness of the manufacturing method which is an embodiment of the invention to be disclosed can be confirmed by this comparative example.

This application is based on Japanese Patent Application serial no. 2008-149716 filed with Japan Patent Office on Jun. 6, 2008, the entire contents of which are hereby incorporated by reference.

What is claimed is:
1. A method for manufacturing a semiconductor device, comprising:
irradiating ions to a single crystal semiconductor substrate in which a first impurity semiconductor layer is formed by adding an impurity element imparting one conductivity type to the single crystal semiconductor substrate wherein a damaged region is formed in the single crystal semiconductor substrate by the irradiation of the ions;
forming a first electrode and an insulating layer over a surface of the single crystal semiconductor substrate;
closely attaching the insulating layer and a supporting substrate to each other to bond the single crystal semiconductor substrate and the supporting substrate together;
separating the single crystal semiconductor substrate at the damaged region to provide a stack including at least the insulating layer, the first electrode, the first impurity semiconductor layer over the supporting substrate;
forming a first semiconductor layer to which an impurity element imparting the one conductivity type is added over the first impurity semiconductor layer;
forming a second semiconductor layer to which an impurity element imparting the one conductivity type is added over the first semiconductor layer under a condition different from that of the first semiconductor layer;
improving crystallinity of the first semiconductor layer and crystallinity of the second semiconductor layer by a solid-phase growth method to form a second impurity semiconductor layer;
adding an impurity element imparting the one conductivity type to the second impurity semiconductor layer to form a source region and a drain region;
adding an impurity element imparting a conductivity type different from the one conductivity type to the second impurity semiconductor layer to form a channel region; and
forming a gate electrode layer over the channel region with a gate insulating layer interposed therebetween.

2. A method for manufacturing a semiconductor device, according to claim 1, wherein an impurity concentration of the second impurity semiconductor layer is lower than an impurity concentration of the first impurity semiconductor layer.

3. A method for manufacturing a semiconductor device, according to claim 1, wherein the first semiconductor layer is formed so as to have a thickness of greater than or equal to 10 nm and less than or equal to 50 nm and the second semiconductor layer is formed so as to have a thickness of greater than or equal to 300 nm.

4. A method for manufacturing a semiconductor device, according to claim 1, wherein ions generated using a source gas including hydrogen are used as the ions.

5. A method for manufacturing a semiconductor device, according to claim 1, wherein formation of the first semiconductor layer is performed by a plasma chemical vapor deposition method in which a flow rate of a hydrogen gas is greater than or equal to 50 times that of a silane-based gas.

6. A method for manufacturing a semiconductor device, comprising:
irradiating ions to a single crystal semiconductor substrate in which a first impurity semiconductor layer is formed by adding an impurity element imparting one conductivity type to the single crystal semiconductor substrate wherein a damaged region is formed in the single crystal semiconductor substrate by the irradiation of the ions;
forming a first electrode and an insulating layer over a surface of the single crystal semiconductor substrate;
closely attaching the insulating layer and a supporting substrate to each other to bond the single crystal semiconductor substrate and the supporting substrate together;
separating the single crystal semiconductor substrate at the damaged region to provide a stack including at least the insulating layer, the first electrode, the first impurity semiconductor layer over the supporting substrate;
forming a first semiconductor layer to which an impurity element imparting the one conductivity type is added over the first impurity semiconductor layer;
forming a second semiconductor layer to which an impurity element imparting the one conductivity type is added over the first semiconductor layer under a condition different from that of the first semiconductor layer;
improving crystallinity of the first semiconductor layer and crystallinity of the second semiconductor layer by a solid-phase growth method to form a second impurity semiconductor layer;
adding an impurity element imparting the one conductivity type to the second impurity semiconductor layer to form a source region and a drain region;
adding an impurity element imparting a conductivity type different from the one conductivity type to the second impurity semiconductor layer to form a channel region; and
forming a gate electrode layer over the channel region with a gate insulating layer interposed therebetween,
wherein the first semiconductor layer and the second semiconductor layer are formed so that crystallinity of the first semiconductor layer is higher than that of the second semiconductor layer.

7. A method for manufacturing a semiconductor device, according to claim 6, wherein the first semiconductor layer is formed so as to have a thickness of greater than or equal to 10 nm and less than or equal to 50 nm and the second semiconductor layer is formed so as to have a thickness of greater than or equal to 300 nm.

8. A method for manufacturing a semiconductor device, according to claim 6, wherein ions generated using a source gas including hydrogen are used as the ions.

9. A method for manufacturing a semiconductor device, according to claim 6, wherein formation of the first semiconductor layer is performed by a plasma chemical vapor deposition method in which a flow rate of a hydrogen gas is greater than or equal to 50 times that of a silane-based gas.

10. A method for manufacturing a semiconductor device, comprising:
irradiating ions to a single crystal semiconductor substrate in which a first impurity semiconductor layer is formed by adding an impurity element imparting one conductivity type to the single crystal semiconductor substrate wherein a damaged region is formed in the single crystal semiconductor substrate by the irradiation of the ions;
forming a first electrode and an insulating layer over a surface of the single crystal semiconductor substrate;
closely attaching the insulating layer and a supporting substrate to each other to bond the single crystal semiconductor substrate and the supporting substrate together;
separating the single crystal semiconductor substrate at the damaged region to provide a stack including at least the insulating layer, the first electrode, the first impurity semiconductor layer over the supporting substrate;
forming a first semiconductor layer to which an impurity element imparting the one conductivity type is added over the first impurity semiconductor layer;
forming a second semiconductor layer to which an impurity element imparting the one conductivity type is added over the first semiconductor layer under a condition different from that of the first semiconductor layer;
improving crystallinity of the first semiconductor layer and crystallinity of the second semiconductor layer by a solid-phase growth method to form a second impurity semiconductor layer;
adding an impurity element imparting the one conductivity type to the second impurity semiconductor layer to form a source region and a drain region;
adding an impurity element imparting a conductivity type different from the one conductivity type to the second impurity semiconductor layer to form a channel region; and
forming a gate electrode layer over the channel region with a gate insulating layer interposed therebetween,
wherein the first semiconductor layer and the second semiconductor layer are formed so that a hydrogen concentration of the first semiconductor layer is lower than that of the second semiconductor layer.

11. A method for manufacturing a semiconductor device, according to claim 10, wherein the first semiconductor layer is formed so as to have a thickness of greater than or equal to 10 nm and less than or equal to 50 nm and the second semiconductor layer is formed so as to have a thickness of greater than or equal to 300 nm.

12. A method for manufacturing a semiconductor device, according to claim 10, wherein ions generated using a source gas including hydrogen are used as the ions.

13. A method for manufacturing a semiconductor device, according to claim 10, wherein formation of the first semiconductor layer is performed by a plasma chemical vapor deposition method in which a flow rate of a hydrogen gas is greater than or equal to 50 times that of a silane-based gas.

* * * * *